United States Patent
Oshima et al.

(10) Patent No.: US 10,644,115 B2
(45) Date of Patent: May 5, 2020

(54) LAYERED STRUCTURE AND SEMICONDUCTOR DEVICE INCLUDING LAYERED STRUCTURE

(71) Applicant: FLOSFIA INC., Kyoto (JP)

(72) Inventors: Takayoshi Oshima, Saga (JP); Takashi Shinohe, Kyoto (JP); Isao Takahashi, Kyoto (JP)

(73) Assignee: FLOSFIA INC., Kyoto (JP)

(*) Notice: Subject to any disclaimer, the term of this patent is extended or adjusted under 35 U.S.C. 154(b) by 0 days.

(21) Appl. No.: 16/284,302

(22) Filed: Feb. 25, 2019

(65) Prior Publication Data

US 2019/0267450 A1 Aug. 29, 2019

(30) Foreign Application Priority Data

Feb. 28, 2018 (JP) .................... 2018-36003

(51) Int. Cl.
*H01L 29/15* (2006.01)
*H01L 21/02* (2006.01)
(Continued)

(52) U.S. Cl.
CPC ........ *H01L 29/155* (2013.01); *H01L 21/0228* (2013.01); *H01L 21/02507* (2013.01);
(Continued)

(58) Field of Classification Search
CPC . H01L 29/155; H01L 29/04; H01L 29/78687; H01L 21/02565; H01L 21/0228;
(Continued)

(56) References Cited

U.S. PATENT DOCUMENTS 6,528,387 B1* 3/2003 Moriyasu ............ H01L 21/2007
257/E21.122
6,768,175 B1* 7/2004 Morishita ........... H01L 21/2007
257/347
(Continued)

FOREIGN PATENT DOCUMENTS

| JP | 2015-017027 | 1/2015 |
| JP | 2016-051825 | 4/2016 |
| JP | 2016-156073 | 9/2016 |

OTHER PUBLICATIONS

Rustum Roy et al., "Polymorphism of $Ga_2O_3$ and the System $Ga_2O_3$—$H_2O$", Contribution from School of Industries, The Pennsylvania State College, Feb. 5, 1952, pp. 719-722.
(Continued)

*Primary Examiner* — Dao H Nguyen
(74) *Attorney, Agent, or Firm* — Wenderoth, Lind & Ponack, L.L.P.

(57) ABSTRACT

In a first aspect of a present inventive subject matter, a layered structure includes a base layer, and a crystalline oxide film including a corundum structure and including an r-plane as a principal plane. The crystalline oxide film is directly arranged on the base layer or through at least one layer that is adjacently arranged to the base layer, and the crystalline oxide film is with a full width at half maximum (FWHM) of rocking curve that is 0.1° or less by ω-scan X-ray diffraction (XRD) measurement.

20 Claims, 14 Drawing Sheets

(51) Int. Cl.
*H01L 29/04* (2006.01)
*H01L 29/786* (2006.01)

(52) U.S. Cl.
CPC ........ *H01L 21/02565* (2013.01); *H01L 29/04* (2013.01); *H01L 29/78687* (2013.01)

(58) Field of Classification Search
CPC ......... H01L 21/02507; H01L 21/02609; H01L 21/02516; H01L 21/02483; H01L 21/02488
USPC ....... 257/13, 15, 43, 76, 103, 104, 189, 267, 257/352, 628, E33.023, E21.121, 257/E21.122, E21.256, E21.564; 438/43, 438/48, 104, 404, 413, 478, 479
See application file for complete search history.

(56) References Cited

U.S. PATENT DOCUMENTS

| | | | | |
|---|---|---|---|---|
| 7,400,030 | B2* | 7/2008 | Lu | ................... H01L 31/022408 257/347 |
| 2007/0045654 | A1* | 3/2007 | Choi | ..................... H01L 33/007 257/103 |
| 2011/0012109 | A1* | 1/2011 | Kryliouk | ............. H01L 21/0237 257/49 |
| 2012/0086017 | A1* | 4/2012 | Hwang | ............... H01L 21/0237 257/76 |
| 2012/0145991 | A1* | 6/2012 | Nam | ..................... H01L 33/007 257/13 |
| 2013/0240895 | A1* | 9/2013 | Chyi | ................. H01L 29/66212 257/76 |
| 2014/0077223 | A1* | 3/2014 | Choe | ....................... C30B 25/04 257/76 |
| 2015/0194479 | A1 | 7/2015 | Kaneko et al. | |
| 2015/0225843 | A1* | 8/2015 | Oda | ................. H01L 21/02601 427/255.28 |
| 2015/0279927 | A1 | 10/2015 | Hitora et al. | |

OTHER PUBLICATIONS

Raveen Kumaran, "New Solid State Laser Crystals Created by Epitaxial Growth", Dissertation, The University of British Columbia (Vancouver), Sep. 2012.

Kentaro Kaneko, "Growth and Physical Properties of Corundum-Structured Gallium Oxide Alloy Thin Films", Dissertation, Kyoto Univ., Mar. 2013, with English Abstract.

* cited by examiner

LAYERED STRUCTURE AND SEMICONDUCTOR DEVICE INCLUDING LAYERED STRUCTURE

CROSS-REFERENCE TO RELATED APPLICATION

This application is a new U.S. patent application that claims priority benefit of Japanese patent application No. 2018-36003 filed on Feb. 28, 2018, the disclosures of which are incorporated herein by reference in its entirety.

BACKGROUND OF THE INVENTION

Field of the Invention

The present disclosure relates to a crystalline oxide film with a corundum structure and an r-plane as a principal plane. Also, the present disclosure relates to a crystalline oxide semiconductor film with a corundum structure and an r-plane as a principal plane. Furthermore, the present disclosure relates to a layered structure including a crystalline oxide film. The present disclosure relates to a semiconductor device including at least a crystalline oxide semiconductor film with a corundum structure and an r-plane as a principal plane. The present disclosure relates to a semiconductor system including a semiconductor device. Furthermore, the present disclosure relates to a method of forming a crystalline oxide semiconductor film with a corundum structure and an r-plane as a principal plane, a method of forming a layered structure including a crystalline oxide film with a corundum structure and an r-plane as a principal plane, and/or a method of manufacturing a semiconductor device including at least a crystalline oxide semiconductor film with a corundum structure and an r-plane as a principal plane.

Description of the Related Art

As a background, gallium oxide ($Ga_2O_3$) is known to possess five different polymorphs including $\alpha$-, $\beta$-, $\gamma$-, $\delta$-, and $\varepsilon$-phases (for reference, see NPL1: Rustum Roy et al, "Polymorphism of $Ga_2O_3$ and the System $Ga_2O_3$—$H_2O$").

It is open to the public that Nd-doped films containing gallium oxide are grown on sapphire substrates with different orientations such as a c-plane sapphire substrate, an r-plane sapphire substrate, an a-plane sapphire substrate, and an m-plane sapphire substrate by use of a Molecular Beam Epitaxy (MBE) method. It is mentioned that "Unlike the semiconductors, however, the oxides are more difficult to grow in single-phase form due to the variety of other phases that might appear. The growth of $\alpha$-$Ga_2O_3$ is further complicated by the dominance of $\beta$-$Ga_2O_3$, the stable phase when formed in bulk at/near atmospheric pressure" (for reference, see NPL2: Raveen Kumaran, "New Solid State Laser Crystals Created by Epitaxial Growth", Dissertation, the University of British Columbia (Vancouver) issued in September 2012).

It is suggested that a band gap of gallium oxide ($Ga_2O_3$) is able to be controlled by forming a mixed crystal with indium and/or aluminum. Also, the reason why a thin film of $\alpha$-$Ga_2O_3$ was obtained in high quality on a c-plane sapphire substrate by use of a mist Chemical Vapor Deposition (CVD) method in spite of the lattice mismatch that is as large as 3.2% to 4.5% between $\alpha$-$Al_2O_3$ (sapphire substrate) and $\alpha$-$Ga_2O_3$ was figured out (for reference, see NPL 3: Kentaro KANEKO, "Fabrication and physical properties of corundum-structured alloys based on gallium oxide", Dissertation, Kyoto Univ., issued in March 2013, summary and contents were open to the public on Jan. 31, 2014).

However, a crystalline oxide film with a corundum structure mentioned above was not satisfactory in crystallinity.

Regarding the mixed crystal, InAlGaO based semiconductors represented by $In_XAl_YGa_ZO_3$ ($0 \leq X \leq 2$, $0 \leq Y \leq 2$, $0 \leq Z \leq 2$, $X+Y+Z=1.5$ to $2.5$) are extremely attractive materials (for reference, see No. US2015/194479A1). It is described that a crystalline oxide with a corundum structure contains aluminum and gallium and a phase transformation of the crystalline oxide at a high temperature is suppressed.

Also, it is open to the public that a corundum-structured oxide crystal containing at least one of an indium atom and a gallium atom, and the corundum-structured oxide crystal containing the at least one aluminum atom positioned in a gap between lattice points of a crystal lattice, and a semiconductor device including the corundum-structured oxide crystal to suppress phase transition of the corundum-structured oxide crystal at a high temperature (for reference, see JP2015-017027A).

Furthermore, it is open to the public that a layered structure in that layers as a first layer and layers as a second layer are alternately stacked to have a quantum well structure. The first layer contains a corundum-structured oxide as a major component, and the second layer contains as a major component an oxide containing aluminum that is different from the major component of the first layer. The layered structure with the quantum well structure that is used as a buffer layer and a semiconductor device including the layered structure are open to the public (for reference, see JP2016-51825A and JP2016-156073A).

SUMMARY OF THE INVENTION

In a first aspect of a present inventive subject matter, a layered structure includes a base layer, and a crystalline oxide film including a corundum structure and including an r-plane as a principal plane. The crystalline oxide film is directly arranged on the base layer or through at least one layer that is adjacently arranged to the base layer, and the crystalline oxide film is with a full width at half maximum (FWHM) of rocking curve that is 0.1° or less by $\omega$-scan X-ray diffraction (XRD) measurement.

According to an embodiment of a layered structure of a present inventive subject matter, the crystalline oxide film is a coherent layer that is coherently grown from the base layer or coherently grown from the at least one layer that is adjacently arranged to the base layer.

Also, it is suggested that the crystalline oxide film is a semiconductor film.

According to an embodiment of a layered structure of a present inventive subject matter, the crystalline oxide film contains gallium oxide as a major component.

Furthermore, according to an embodiment of a layered structure of a present inventive subject matter, the crystalline oxide film contains as a major component a mixed crystal containing gallium oxide.

Also, according to an embodiment of a layered structure of a present inventive subject matter, the at least one layer that is adjacently arranged to the base layer includes a crystalline oxide film containing aluminum oxide as a major component.

Furthermore, according to an embodiment of a layered structure of a present inventive subject matter, the at least one layer that is adjacently arranged to the base layer includes a crystalline oxide film containing as a major component a mixed crystal comprising aluminum oxide.

In a second aspect of a present inventive subject matter, a layered structure includes a first layer with a first composition, and the first layer includes a corundum structure and an r-plane as a principal plane. The layered structure further includes a second layer with a second composition that is different from the first composition. There are two or more layers as the first layer and two or more layers as the second layer, and accordingly, the two or more layers as the first layer and the two or more layers as the second layer are alternately stacked to be the layered structure with a superlattice. At least one of the first layers is a crystalline oxide film that includes a full width at half maximum (FWHM) of rocking curve that is 0.1° or less by ω-scan X-ray diffraction (XRD) measurement.

Also, it is suggested that the first composition of the first layer is a crystalline oxide containing gallium oxide as a major component according to an embodiment of a present inventive subject matter.

Furthermore, it is suggested that the first composition of the first layer is a crystalline oxide containing as a major component a mixed crystal that contains gallium oxide according to an embodiment of a present inventive subject matter.

It is suggested that the second composition of the second layer is a crystalline oxide containing aluminum oxide as a major component.

Also, it is suggested that the second composition of the second layer is a crystalline oxide containing as a major component a mixed crystal that contains aluminum oxide.

In a third aspect of a present inventive subject matter, a layered structure includes a first layer with a first composition that includes a corundum structure and an r-plane as a principal plane; and a second layer with a second composition that is different from the first composition of the first layer, the first layer that is arranged on the second layer, and at least one of the first layer and the second layer includes a crystalline oxide film without a crystal dislocation.

It is suggested that the first layer and the second layer are alternately stacked to be a layered structure with a superlattice, and at least one of the first layer and the second layer includes a crystalline oxide film with a full width at half maximum (FWHM) of rocking curve that is 0.1° or less by ω-scan X-ray diffraction (XRD) measurement.

Also, it is suggested that the first composition of the first layer contains at least one crystalline oxide semiconductor selected from a crystalline oxide semiconductor that contains gallium oxide as a major component and a crystalline oxide semiconductor that contains as a major component a mixed crystal containing gallium oxide.

It is suggested that the second composition of the second layer contains at least one selected from a crystalline oxide that contains aluminum oxide as a major component and a crystalline oxide that contains as a major component a mixed crystal that contains aluminum oxide.

Also, it is suggested that the second composition of the second layer is a crystalline oxide containing as a major component a mixed crystal that contains aluminum oxide.

According to an embodiment of a present inventive subject matter, a semiconductor device includes the layered structure includes a first side and a second side that is an opposite side of the first side; a first electrode positioned at the first side of the layered structure; and a second electrode positioned at the first side of the layered structure and spaced from the first electrode.

In a fourth aspect of a present inventive subject matter, a crystalline oxide semiconductor film contains at least one crystalline oxide semiconductor selected from a crystalline oxide semiconductor containing gallium oxide as a major component and a crystalline oxide semiconductor containing as a major component a mixed crystal containing gallium oxide. The crystalline oxide semiconductor film is an r-plane crystalline oxide semiconductor film with a full width at half maximum (FWHM) of rocking curve that is 0.1° or less by ω-scan X-ray diffraction (XRD) measurement.

It is suggested that a crystalline oxide semiconductor film is with electrical resistivity that is 0.1 Ωcm or less.

Also, it is suggested that a crystalline oxide film is with electrical resistivity that is in a range of 0.01 Ωcm to 0.07 Ωcm according to an embodiment of a crystalline oxide semiconductor film of a present inventive subject matter.

Also, according to an embodiment of a present inventive subject matter, a semiconductor device includes the layered structure that includes a first side and a second side that is an opposite side of the first side; a first electrode positioned at the first side of the layered structure; and a second electrode positioned at the second side of the layered structure.

Furthermore, according to an embodiment of a system of a present inventive subject matter, a system includes a circuit board; and the semiconductor device electrically connected to the circuit board.

According to an embodiment of a layered structure of a present inventive subject matter, the crystalline oxide film contains gallium oxide as a major component.

Furthermore, according to an embodiment of a layered structure of a present inventive subject matter, the crystalline oxide film contains as a major component a mixed crystal containing gallium oxide.

Also, it is suggested that the crystalline oxide film is without a crystal dislocation.

DETAILED DESCRIPTION OF EMBODIMENTS

Figure 1:
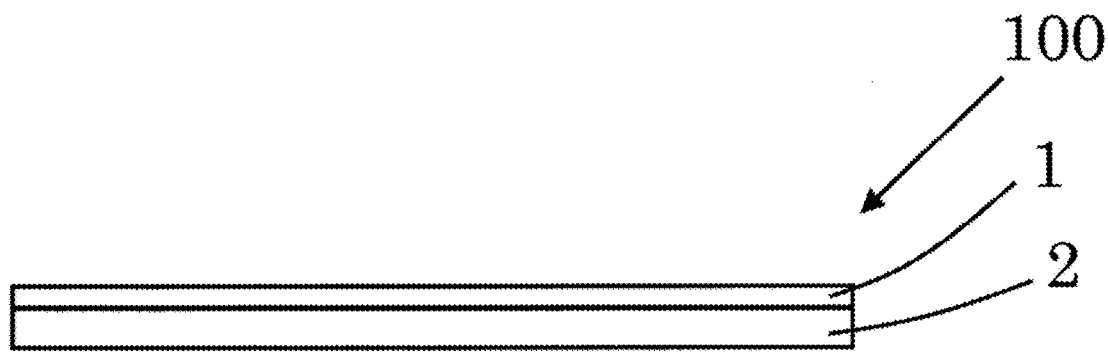
FIG. 1 shows a schematic side view of a layered structure according to a first embodiment of a present inventive subject matter.

The terminology used herein is for the purpose of describing particular embodiments only and is not intended to be limiting of the subject matter. As used herein, the singular forms "a", "an" and "the" are intended to include the plural forms as well, unless the context clearly indicates otherwise.

As used herein, the term "and/or" includes any and all combinations of one or more of the associated listed items.

As illustrated in the figures submitted herewith, some sizes of structures or portions may be exaggerated relative to other structures or portions for illustrative purposes. Relative terms such as "below" or "above" or "upper" or "lower" or "bottom" may be used herein to describe a relationship of one element, layer or region to another element, layer or region as illustrated in the figures. It will be understood that these terms are intended to encompass different orientations of a layer, a device, and/or a system in addition to the orientation depicted in the figures.

In a first aspect of a present inventive subject matter, a layered structure includes a base layer, and a crystalline oxide film including a corundum structure and including an r-plane as a principal plane. The crystalline oxide film is directly arranged on the base layer or through at least one layer that is adjacently arranged to the base layer, and the crystalline oxide film is with a full width at half maximum (FWHM) of rocking curve that is 0.1° or less by ω-scan X-ray diffraction (XRD) measurement.

In a second aspect of a present inventive subject matter, a layered structure includes a first layer with a first composition, and the first layer includes a corundum structure and an r-plane as a principal plane. The layered structure further includes a second layer with a second composition that is different from the first composition. There are two or more layers as the first layer, and there are two or more layers as the second layer, and accordingly, the first layers and the second layers are alternately stacked to form a superlattice. At least one of the first layers is a crystalline oxide film with a full width at half maximum (FWHM) of rocking curve that is 0.1° or less by ω-scan X-ray diffraction (XRD) measurement.

In a third aspect of a present inventive subject matter, a layered structure includes a first layer with a first composition that includes a corundum structure and an r-plane as a principal plane; and a second layer with a second composition that is different from the first composition of the first layer. The first layer is arranged on the second layer, and at least one of the first layer and the second layer includes a crystalline oxide film without a crystal dislocation.

In a fourth aspect of a present inventive subject matter, a crystalline oxide semiconductor film contains at least one crystalline oxide semiconductor selected from a crystalline oxide semiconductor containing gallium oxide as a major component and a crystalline oxide semiconductor containing as a major component a mixed crystal containing gallium oxide. The crystalline oxide semiconductor film is an r-plane crystalline oxide semiconductor film with a full width at half maximum (FWHM) of rocking curve that is 0.1° or less by ω-scan X-ray diffraction (XRD) measurement.

In a fifth aspect of a present inventive subject matter, a layered structure includes at least a first layer that is a crystalline oxide film containing as a major component corundum-structured gallium oxide or corundum-structured mixed crystal containing at least two selected from gallium oxide, indium oxide and aluminum oxide and including an r-plane as a principal plane, a second layer that is a crystalline oxide film containing as a major component aluminum oxide with a corundum structure and including an r-plane as a principal plane, and a third layer that is a crystalline oxide film containing as a major component corundum structured aluminum oxide or corundum-structured mixed crystal containing at least two selected from aluminum oxide, gallium oxide and indium oxide and including an r-plane as a principal plane. The layered structure may include a fourth layer containing as a major component corundum-structured metal oxide with an r-plane as a principal plane on the third layer and more layers stacked on the fourth layer.

According to an embodiment of a layered structure of a present inventive subject matter, the layered structure includes a first layer with a first composition that includes a corundum structure and an r-plane as a principal plane; and a second layer with a second composition that is different from the first composition of the first layer. The first layer is arranged on the second layer. The first composition of the first layer may contain as a major component gallium oxide with a corundum structure. Also, the first composition of the first layer may contain as a major component a mixed crystal with a corundum structure containing gallium oxide. The second composition of the second layer may contain as a major component aluminum oxide with a corundum structure. Also, the second composition of the second layer may contain as a major component a mixed crystal with a corundum structure containing aluminum oxide. The first composition of the first layer is different from the second composition of the second layer. The first layer that is arranged on the second layer, and at least one of the first layer and the second layer comprising a crystalline oxide film without a crystal dislocation.

Embodiments of the subject matter now will be described more hereinafter with reference to the accompanying drawings, in which embodiments of the subject matter are shown. This subject matter may, however, be embodied in many different forms and should not be construed as limited to the embodiments set forth herein. Rather, these embodiments are provided so that this disclosure will be thorough and complete, and will fully convey the scope of the subject matter to those skilled in the art.

FIG. 1 shows a schematic side view of a layered structure according to a first embodiment according to a present inventive subject matter. The layered structure 100 includes a first layer 1 with a first composition and a second layer 2 with a second composition that is different from the first composition. The first layer 1 is arranged on the second layer 2. The first composition of the first layer 1 contains gallium oxide with a corundum structure or a mixed crystal with a corundum structure containing gallium oxide. The second composition of the second layer 2 may contain aluminum oxide with a corundum structure or a mixed crystal with a corundum structure containing gallium oxide. The first layer 1 has a full width at half maximum (FWHM) of rocking curve that is 0.1° or less by ω-scan X-ray diffraction (XRD) measurement, and the first layer 1 has an r-plane as a principal plane. The second layer 2 also has an r-plane as a principal plane. The layered structure may include two or more layers in embodiments as explained below. Also, the second layer 2 may be a base layer that may be an r-plane sapphire substrate. Furthermore, as an embodiment of a present inventive subject matter, the first layer 1 having a full width at half maximum (FWHM) of rocking curve that is 0.1° or less by ω-scan X-ray diffraction (XRD) measurement may be separated from the layered structure 100 and used as a crystalline oxide film.

The layered structure 100 may have a square shape in a plan view. Also, the layered structure 100 may have a rectangular shape in a top plan view. Furthermore, the layered structure 100 may have a circular shape in a top plan view. The size and shape of the layered structure may be selected according to a purpose of use of the layered structure, for example. According to an embodiment of a present inventive subject matter, a layered structure preferably includes a layer containing gallium oxide having a corundum structure. Also, the number of the layers included in the layered structure may be selected according to a purpose of use, for example.

Figure 24:
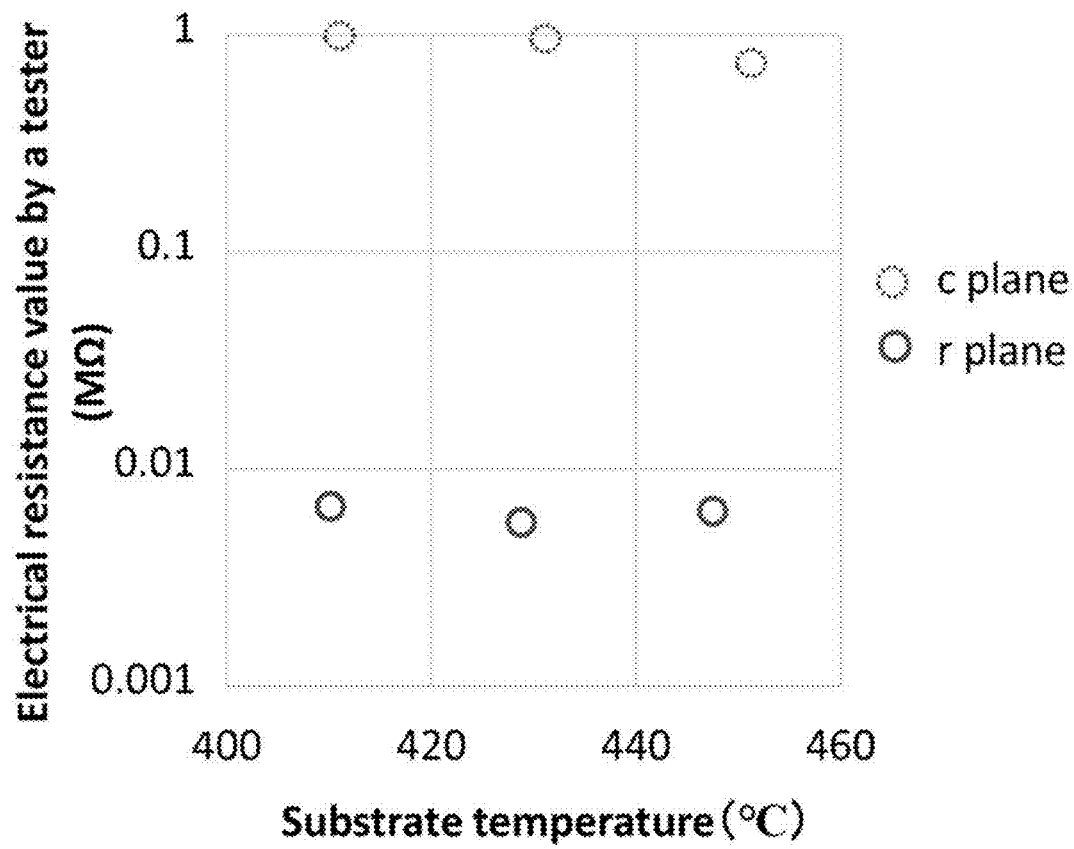
FIG. 24 is a graph showing a difference between a c-plane crystalline oxide semiconductor film containing tin (Sn) atoms as a dopant and gallium oxide and an r-plane crystalline oxide semiconductor film containing tin (Sn) atoms as a dopant and gallium oxide, from the viewpoint of electrical resistance value by a tester with different temperatures ranged from 400° C. to 460° C. of sapphire substrate during film formation.

The layered structure 100 according to this embodiment includes the first layer and the second layer each including an r-plane as a principal plane. The layered structure 100 may be also used as a buffer layer or a base layer to obtain a crystalline oxide film with an enhanced semiconductor property on the layered structure 100. Such an r-plane crystalline oxide film having semiconductor properties are obtainable on a layered structure according to an embodiment of a present inventive subject matter by use of mist CVD apparatus shown in FIG. 20, for example. Also, a crystalline oxide film with an r-plane as a principal plane (r-plane crystalline oxide film) tends to have a more enhanced semiconductor property than a crystalline oxide film with a c-plane as a principal plane (c-plane crystalline oxide film). FIG. 24 is a graph showing a difference between a c-plane crystalline oxide semiconductor film containing tin (Sn) atoms as a dopant and gallium oxide and an r-plane crystalline oxide semiconductor film containing tin (Sn) atoms as a dopant and gallium oxide, from the viewpoint of electrical resistance value by a tester with different temperatures ranged from 400° C. to 460° C. of sapphire substrate during film formation. The c-plane crystalline oxide semiconductor films and the r-plane crystalline oxide semiconductor films were obtained under the same conditions except only one condition of using different orientations of sapphire substrate as principle planes (c-plane substrate or r-plane substrate) as a base layer. Accordingly, corundum-structured c-plane crystalline oxide semiconductor films were obtained by use of c-plane sapphire substrates as base layers, and corundum-structured r-plane crystalline oxide semiconductor films were obtained by use of r-plane sapphire substrates as base layers. The crystalline oxide semiconductor films were 10 mm square in size, and film-formation time was 90 minutes. FIG. 24 shows a comparison by electrical resistance value by a tester of the r-plane crystalline oxide films with the c-plane crystalline oxide films, however, electrical resistivity of the obtained r-plane crystalline oxide films was in a range of 0.01 Ωcm to 0.07 Ωcm. Furthermore, r-plane crystalline oxide films were obtained to have 5 μm or more in thickness by increasing film-formation time by use of the mist CVD apparatus, and electrical resistivity of the obtained r-plane crystalline oxide semiconductor films with 5 μm or more in thickness was also in a range of 0.01 Ωcm to 0.07 Ωcm. Accordingly, r-plane crystalline oxide semiconductor films obtained according to embodiments of a present inventive subject matter had more enhanced electrical properties and more enhanced crystallinity than the c-plane crystalline oxide semiconductor films.

According to the embodiment, the first layer contains as a major component gallium oxide with a corundum structure.

The term "as a major component gallium oxide" and/or "gallium oxide as a major component" herein means that a layer (film) contains gallium oxide that is preferably to be 50% or more at atomic ratio in all components contained in the layer (film). According to an embodiment of a present inventive subject matter, the film may preferably contain gallium oxide to be 70% or more at atomic ratio in all components contained in the film, and further preferably 90% or more at atomic ratio. This means that the film may contain gallium oxide closer to be 100%, however, the first layer may contain one or more metal elements in addition to gallium on condition that gallium contained in the first layer is to be 0.5 or more at atomic ratio when all metal elements contained in the first layer are defined as 1 (one) at atomic ratio. Gallium oxide contained in the first film is preferably 0.8 or more at atomic ratio when all metal elements are contained in the first layer as 1 (one) at atomic ratio, according to an embodiment of the present inventive subject matter.

Also, according to an embodiment of a present inventive subject matter, a layer contains as a major component a mixed crystal containing gallium oxide with a corundum structure. The term "as a major component a mixed crystal" herein means that a layer contains a mixed crystal containing gallium oxide with a corundum structure preferably to be 50% or more at atomic ratio in all components contained in the layer.

According to an embodiment of a present inventive subject matter, the film may preferably contain the mixed crystal with the corundum structure to be 70% or more, and further preferably 90% or more. This means that the film may contain the mixed crystal with the corundum structure closer to be 100%, however, the first layer may contain one or more metal elements in addition to gallium on condition that gallium contained in the first layer is to be 0.5 or more at atomic ratio when all metal elements contained in the first layer are defined as 1 (one) at atomic ratio. The first film is preferably 0.8 or more at atomic ratio when all metal elements contained in the first layer are defined as 1 (one) at atomic ratio, according to an embodiment of the present inventive subject matter.

Also, according to an embodiment of a present inventive subject matter, the first layer may be obtained as a crystalline oxide semiconductor layer included in a layered structure. The crystalline oxide semiconductor layer is obtainable by adding impurity atoms as a dopant into the first layer while the first layer is formed. Also, the crystalline oxide semiconductor layer is able to be separated from the layered structure and used as a crystalline oxide semiconductor film.

According to an embodiment of a layered structure of a present inventive subject matter, the first layer and the second layer with high lattice mismatch are alternately stacked to obtain a layered structure with high crystallinity. According to a present inventive subject matter, it is preferable to form a layered structure with a superlattice by stacking the first layer and the second layer alternately.

According to an embodiment of a layered structure of a present inventive subject matter, the second layer contains as a major component aluminum oxide with a corundum structure.

The term "as a major component aluminum oxide" and/or "aluminum oxide as a major component" herein means that a layer contains aluminum oxide, that is preferably to be 50% or more at atomic ratio in all components contained in the layer. According to an embodiment of a present inventive subject matter, the second layer may contain one or more metal elements in addition to aluminum on condition that aluminum contained in the second layer is to be 0.5 or more at atomic ratio when all metal elements contained in the second layer are defined as 1 (one) at atomic ratio. According to the embodiment of the layered structure 100, the second layer preferably has an r-plane as a principal plane.

Figure 2:
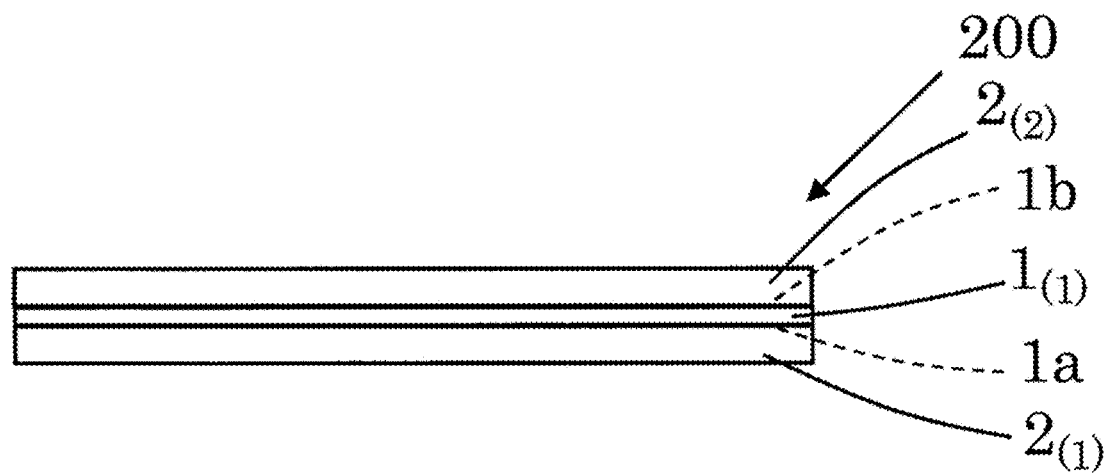
FIG. 2 shows a schematic side view of a layered structure according to a second embodiment of a present inventive subject matter.

FIG. 2 shows a schematic side view of a layered structure according to a second embodiment of a present inventive subject matter. The layered structure 200 includes a first layer $1_{(1)}$ contains as a major component gallium oxide with a corundum structure, a second layer $2_{(1)}$ contains as a major component aluminum oxide with a corundum structure, and a third layer $2_{(2)}$ contains as a major component aluminum oxide with a corundum structure. The first layer $1_{(1)}$ includes a first surface 1a and a second surface 1b that is an opposite surface of the first surface.

The second layer $2_{(1)}$ is positioned on the first surface 1a of the first layer $1_{(1)}$. The third layer $2_{(2)}$ is positioned on the second surface 1b of the first layer $1_{(1)}$.

Figure 3:
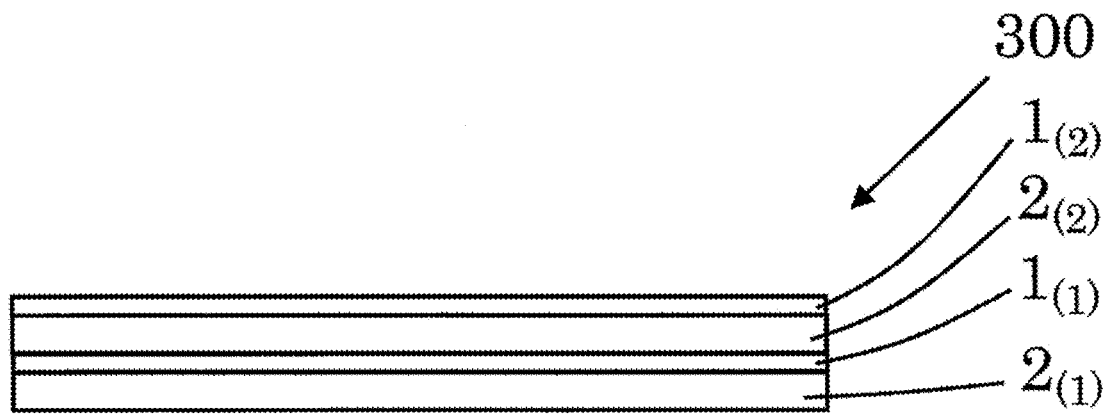
FIG. 3 shows a schematic side view of a layered structure according to a third embodiment of a present inventive subject matter.

FIG. 3 shows a schematic side view of a layered structure according to a third embodiment of a present inventive subject matter. The layered structure 300 includes a first layer $1_{(1)}$ contains as a major component gallium oxide with a corundum structure, a second layer $2_{(1)}$ contains as a major component aluminum oxide with a corundum structure, a third layer $2_{(2)}$ contains as a major component aluminum oxide with a corundum structure, and a fourth layer $1_{(2)}$ contains as a major component gallium oxide with a corundum structure. The first layer $1_{(1)}$ includes a first surface 1a and a second surface 1b that is an opposite surface of the first surface.

The second layer $2_{(1)}$ is positioned on the first surface 1a of the first layer $1_{(1)}$. The third layer $2_{(2)}$ is positioned on the second surface 1b of the first layer $1_{(1)}$. The fourth layer $1_{(2)}$ is positioned on the third layer $2_{(2)}$. Accordingly, layers each containing as a major component gallium oxide with a corundum structure as a first layer and layers each containing as a major component aluminum oxide with a corundum structure are alternately stacked. The first layer and the second layer each have an r-plane as a principal plane.

As an embodiment of a layered structure of a present inventive subject matter, the first layer 1 and the second layer 2 may be stacked as crystalline semiconductor layers to be a superlattice. By changing the layer thickness of the first layer 1 and/or the second layer 2, changing chemical components, and/or changing ratio of the chemical components contained in at least one of the first layer 1 and the second layer 2, properties of the layered structure are adjusted. Also, by alternately stacking crystalline oxide semiconductor layers as the first layers and the second layers to form a layered structure as semiconductor with band structure, the band structure is easily adjusted. The second layer $2_{(1)}$ that is positioned at the bottom of the layered structure 300 may be a sapphire substrate having an r-plane as a principal plane. According to this embodiment, the layered structure 300 includes a first layer and a second layer that are alternately stacked, and at least one layer may be taken off from the layered structure to obtain a crystalline oxide layer with an enhanced semiconductor property or a layered structure with an enhanced semiconductor property. Also, a crystalline oxide film with an r-plane as a principal plane (r-plane crystalline oxide film) is more easily separable from a base layer, an unnecessary portion, and/or the layered structure, compared with a crystalline oxide film with an m-plane as a principal plane (m-plane crystalline oxide film), and the r-plane crystalline oxide films are also expected to be used as self-standing films.

A layered structure according to an embodiment of a present inventive subject matter may include at least one crystalline oxide semiconductor layer. Also, a layered structure may include layers that are crystalline oxide layers and a crystalline oxide semiconductor layer arranged on top of the layers that are crystalline oxide layers. According to an embodiment of a present inventive subject matter, the crystalline oxide semiconductor layer preferably contains as a major component a crystalline oxide semiconductor with a corundum structure. The crystalline oxide semiconductor layer may contain impurity atoms as a dopant. The dopant may be an n-type dopant or a p-type dopant. To obtain a crystalline oxide semiconductor layer with an n-type semiconductor property, the crystalline oxide semiconductor layer preferably contains as a major component a crystalline metal oxide containing at least one metal element selected from metal elements in Group 13 of the periodic table. Examples of the metal element of Group 13 include gallium, aluminum, indium, and titanium. The crystalline oxide semiconductor layer with the n-type semiconductor property preferably contains as a major component a crystal of metal oxide containing at least gallium. The crystal of metal oxide may be a mixed crystal containing at least gallium. The crystalline oxide semiconductor layer with the n-type semiconductor property may be a single crystal or a polycrystal, but the crystalline oxide semiconductor layer with the n-type semiconductor property is preferably a single crystal. According to an embodiment of a semiconductor device of a present inventive subject matter, the semiconductor device preferably includes a crystalline oxide semiconductor layer with an n-type semiconductor property (n-type semiconductor layer) and a crystalline oxide semiconductor layer with a p-type semiconductor property (p-type semiconductor layer). According to an embodiment of a method of manufacturing a layered structure of a present inventive subject matter, the method may include stacking an n-type semiconductor layer and a p-type semiconductor property. Forming semiconductor layers is not particularly limited to a particular method and may be by a known method such as a chemical vapor deposition (CVD) method or a physical vapor deposition (PVD) method. According to an embodiment of the method of manufacturing a layered structure, a mist CVD method is preferable.

According to an embodiment of a layered structure of a present inventive subject matter, the layered structure includes a first layer 1 containing gallium oxide with a corundum structure and a second layer 2 containing aluminum oxide with a corundum structure, and the first layer is a coherent layer. The term "coherent layer" herein means a layer coherently grown from another layer with continuity of lattice.

According to this embodiment, the first layer is coherently grown with continuity of lattice of the second layer. The second layer may be a base layer. Also, the second layer may be a sapphire substrate. Furthermore, the second layer may be a layer stacked on layers of a layered structure, according to an embodiment of a layered structure of a present inventive subject matter. The second layer may be a crystalline oxide layer containing aluminum oxide as a major component. Also, the second layer may be a crystalline oxide layer containing as a major component a mixed crystal containing aluminum oxide.

If the first layer has a higher degree of lattice mismatch with the second layer, a higher degree of lattice distortion to be continued from the first layer to the second layer is observed especially at an interface of the first layer and the second layer. According to a present inventive subject matter, an asymmetric reciprocal lattice map of a layered structure makes it possible to confirm whether a layer is a coherent layer or not, for example.

According to an embodiment of a layered structure of a present inventive subject matter, the layered structure preferably has a superlattice. The term "superlattice" herein means a periodic structure with a crystal lattice longer than a primitive unit lattice by depositing layers of two or more crystal lattices on a layer with the primitive unit lattice.

According to an embodiment of a layered structure of a present inventive subject matter, the layered structure preferably has a quantum well structure. The term "quantum well structure" may be included in the term "superlattice" in a broad sense, and herein means a structure with quantum confinement.

Figure 4:
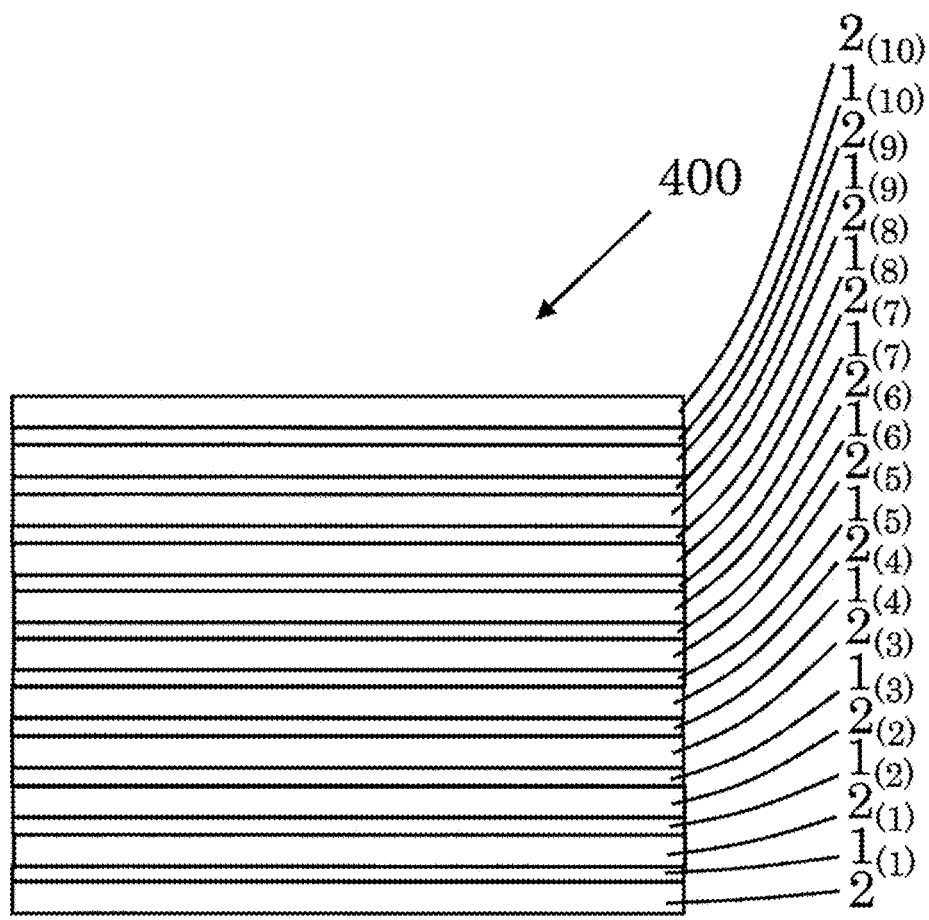
FIG. 4 shows a schematic side view of a layered structure according to a fourth embodiment of a present inventive subject matter.

FIG. 4 shows a schematic side view of a layered structure according to a fourth embodiment of a present inventive subject matter. The layered structure 400 includes a second layer 2 containing aluminum oxide, a first layer 1 containing gallium oxide arranged on the second layer 2. Layers as the second layer 2 and layers as the first layer 1 are alternately stacked to form the layered structure 400 with a superlattice. The layered structure 400 includes 20 layers, for example. The layered structure 400 are formed by depositing layers as the first layer and layers as the second layer alternately by use of a molecular beam epitaxy (MBE) method, which is preferably a radical source MBE method or an ozone-assisted MBE method. The second layer 2 positioned at the bottom of the layered structure 400 may be a sapphire substrate with an r-plane as a principal plane (r-plane sapphire substrate). Also, according to an embodiment of a present inventive subject matter, layers of a layered structure may be deposited by use of a mist CVD method or a pulsed laser deposition (PLD) method. Furthermore, according to an embodiment of a present inventive subject matter, a layered structure may be obtained by use of a combination of an MBE method, a PLD method and/or a CVD method.

Figure 5:
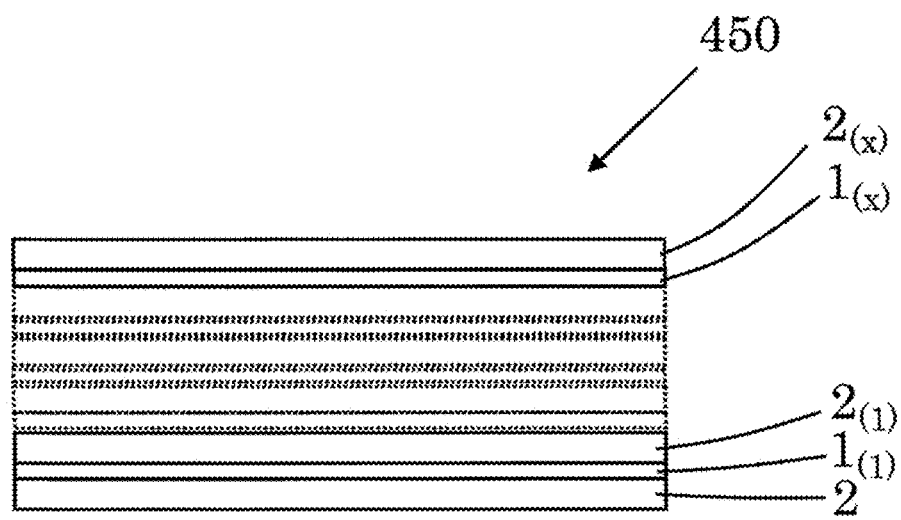
FIG. 5 shows a schematic side view of a layered structure according to a fifth embodiment of a present inventive subject matter.

FIG. 5 shows a schematic side view of a layered structure according to a fifth embodiment of a present inventive subject matter. By alternately stacking layers as the first layer and layers as the second layer, it is possible to obtain a layered structure with less lattice dislocation. The number (x) of layers as the first layer 2 may be set as the same as the number (x) of layers as the second layer 1 or set different from the number (x) of layers as the second layer. The number (x) is an integer.

Figure 6:
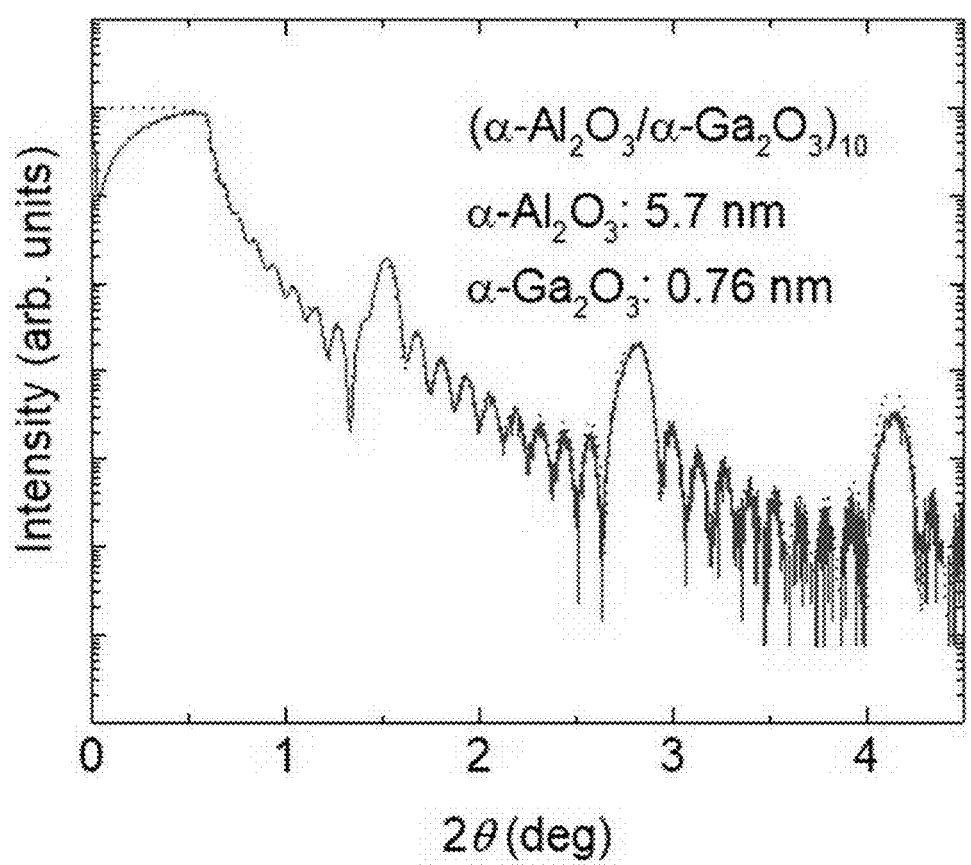
FIG. 6 shows an X-ray reflectivity analysis of the layered structure according to the fourth embodiment of a present inventive subject matter. The horizontal axis indicates an angle of diffraction (deg.) and the vertical axis indicates an intensity of diffraction (arb. units).

FIG. 6 shows an X-ray reflectivity analysis of the layered structure according to the fourth embodiment of a present inventive subject matter. The horizontal axis indicates an angle of diffraction (deg.) and the vertical axis indicates an intensity of diffraction (arb. units). The result of the X-ray reflectivity analysis shown as a line appears to trace a simulation result shown as a dotted line. Accordingly, the result shows that the layered structure in enhanced quality was obtained. Also, the thickness of layers as the first layer is in a range of 0.5 nm to 1 nm. The thickness of layers as the second layer is in a range of 5 nm to 6 nm. For more details, the thickness of layers as the first layer is 0.76 nm, and the thickness of layers as the second layer is 5.7 nm.

Figure 7:
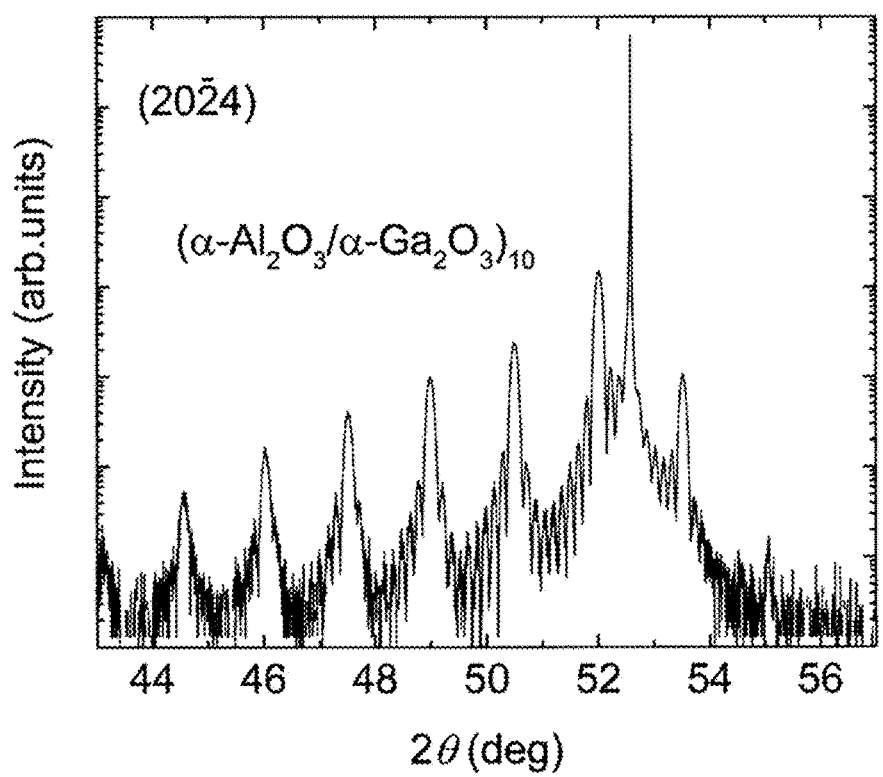
FIG. 7 shows a symmetric XRD (X-ray diffraction) pattern of the layered structure according to the fourth embodiment. The horizontal axis indicates an angle of diffraction (deg.) and the vertical axis indicates an intensity of diffraction (arb. units).
Figure 8:
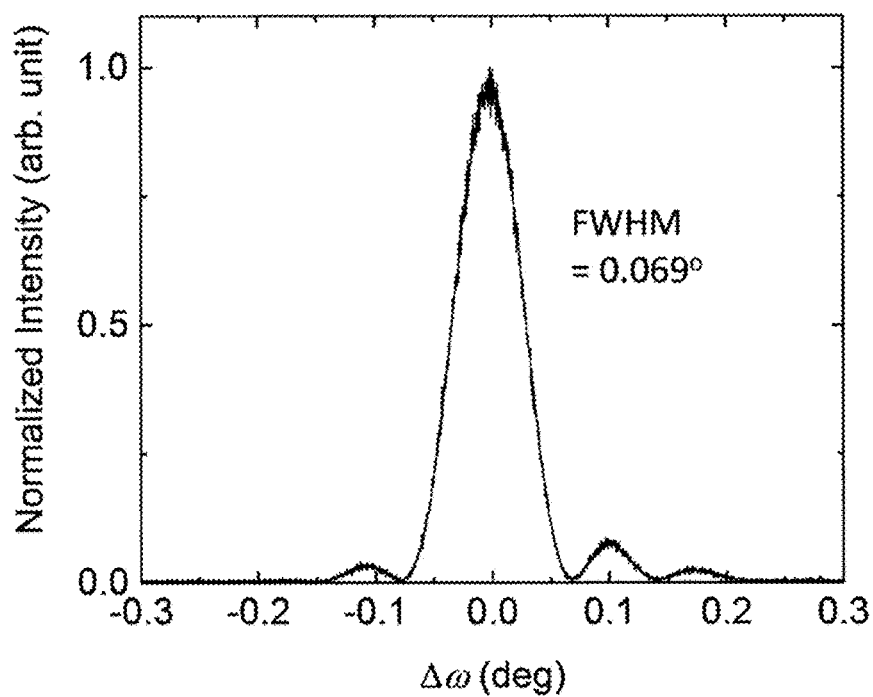
FIG. 8 shows an XRD (X-ray diffraction) data of a crystalline oxide film contained in the layered structure according to the fourth embodiment, showing a full width at half maximum (FWHM) of rocking curve.

FIG. 7 shows a symmetric XRD (X-ray diffraction) pattern of the layered structure according to the fourth embodiment, showing eight peaks between satellite peaks in ten cycles. The horizontal axis indicates an angle of diffraction (deg.) and the vertical axis indicates an intensity of diffraction (arb. units). FIG. 7 shows that a crystalline oxide film as the first layer has a full width at half maximum (FWHM) of rocking curve that is 0.1° or less by $\omega$-scan X-ray diffraction (XRD) measurement. For more details, the first layer 1 shown in FIG. 2 had a full width at half maximum (FWHM) of rocking curve that is 0.069° or less by ω-scan X-ray diffraction (XRD) measurement, showing the layer is in good quality with sharp peaks.

Figure 11A:
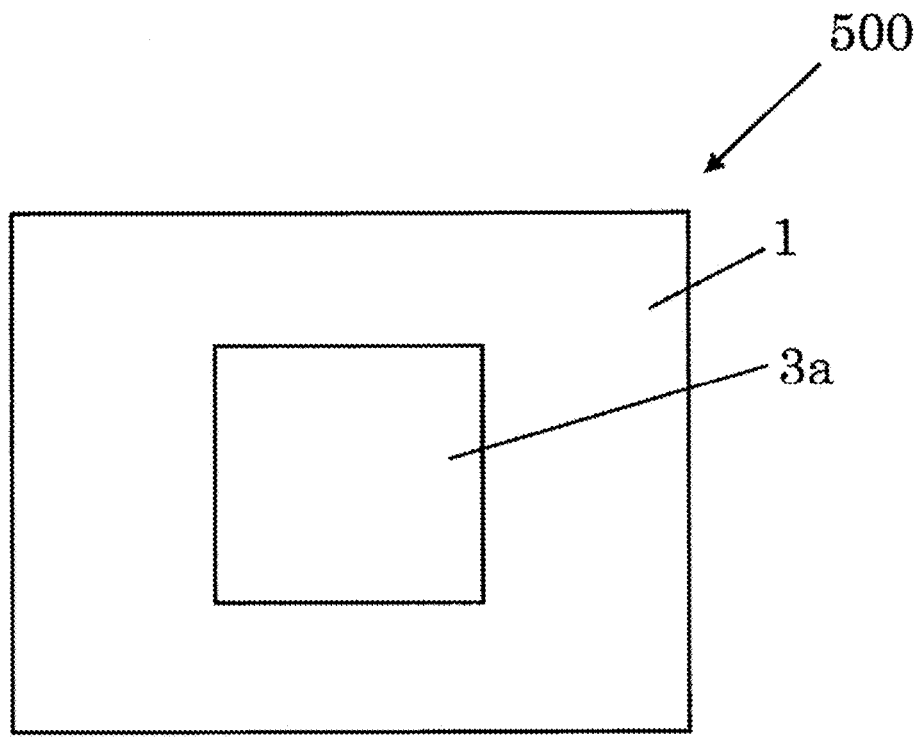
FIG. 11A shows a schematic top plan view of a semiconductor device according to a sixth embodiment of a present inventive subject matter.
Figure 11B:
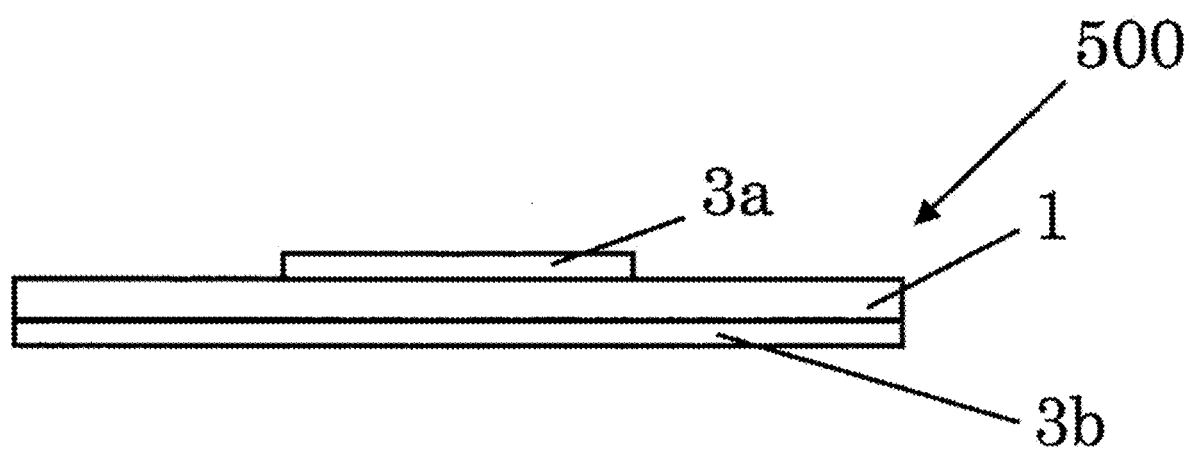
FIG. 11B shows a schematic side view of the semiconductor device shown in FIG. 11A.

FIG. 11A shows a schematic top plan view of a semiconductor device according to a sixth embodiment of a present inventive subject matter. FIG. 11B shows a schematic side view of the semiconductor device shown in FIG. 11A. The semiconductor device 500 includes a first film 1 containing gallium oxide with a corundum structure. The crystalline oxide semiconductor film has a full width at half maximum (FWHM) of rocking curve that is 0.1° or less by ω-scan X-ray diffraction (XRD) measurement. Also, the crystalline oxide semiconductor film with electrical conductivity contains impurity atoms as a dopant. The semiconductor device 500 further includes a first electrode 3a electrically connected to the crystalline oxide semiconductor film 1 and a second electrode 3b electrically connected to the crystalline oxide semiconductor film 1. According to an embodiment of a semiconductor device of a present inventive subject matter, the first electrode 3a is positioned at a first side 1a of the crystalline oxide semiconductor film 1, and the second electrode 3b is positioned at a second side 1b of the crystalline oxide semiconductor film 1. For example, if the semiconductor device 500 is a Schottky diode, the first electrode 3a may be an ohmic electrode and the second electrode 3b may be a Schottky electrode.

Also, the semiconductor device 500 is a MOSFET, the semiconductor device may include a gate electrode, a source electrode, and a drain electrode arranged at one side of the semiconductor device 500.

Materials for each electrode may be known electrode materials. Examples of such an electrode material include metal, such as aluminum (Al), molybdenum (Mo), cobalt (Co), zirconium (Zr), tin (Sn), niobium (Nb), iron (Fe), Cr (chromium), Ta (tantalum), Ti (titanium), Au (gold), Pt (platinum), V (vanadium), Mn (manganese), Ni (nickel), Cu (copper), Hf (hafnium), W (tungsten), Ir (Iridium), Zn (zinc), In (indium), Pd (palladium), Nd (neodymium), and/or Ag (silver), and an alloy containing at least two metals selected from among Al, Mo, Co, Zr, Sn, Nb, Fe, Cr, Ta, Ti, Au, Pt, V, Mn, Ni, Cu, Hf, W, Ir, Zn, In, Pd, Nd, and Ag. Also, examples of the electrode material further include metal oxide conductive films, such as a tin oxide film, a zinc oxide film, an indium oxide film, an indium tin oxide (ITO), and an indium zinc oxide (IZO), organic conductive compounds, such as polyaniline, polythiophene, and polypyrrole, and mixtures of at least two selected from among the examples. Those electrodes may be formed by a known method such as spattering, vacuum deposition, or a CVD method, for example.

Figure 12A:
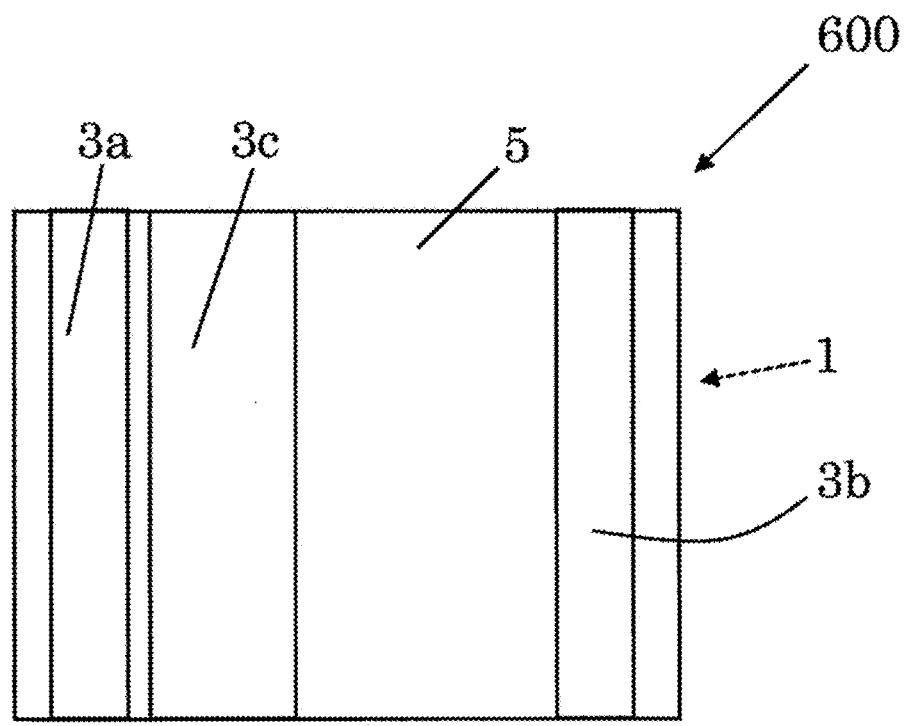
FIG. 12A shows a schematic top plan view of a semiconductor device according to a seventh embodiment of a present inventive subject matter.
Figure 12B:
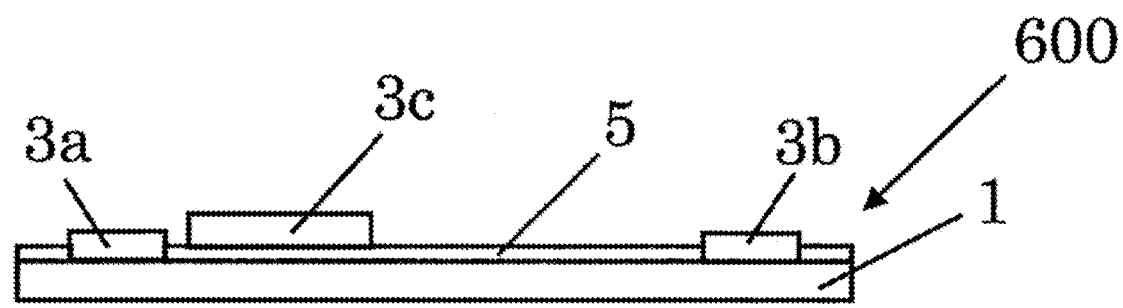
FIG. 12B shows a schematic side view of the semiconductor device shown in FIG. 12A.

FIG. 12A shows a schematic top plan view of a semiconductor device according to a seventh embodiment of a present inventive subject matter. FIG. 12B shows a schematic side view of the semiconductor device shown in FIG. 12A. A crystalline oxide semiconductor film 1 of this embodiment contains gallium oxide with a corundum structure and includes an r-plane as a principal plane. The crystalline oxide semiconductor film 1 has a full width at half maximum (FWHM) of rocking curve that is 0.1° or less by ω-scan X-ray diffraction (XRD) measurement. Also, the crystalline oxide semiconductor film 1 with electrical conductivity contains impurity atoms as a dopant. The semiconductor device 600 includes a first electrode 3a that is electrically connected to the crystalline oxide semiconductor film 1 and a second electrode 3b that is electrically connected to the crystalline oxide semiconductor film 1. The first electrode 3a and the second electrode 3b are arranged at a same side of the crystalline oxide semiconductor film 1. The semiconductor device 600 may further include a third electrode 3c. The third electrode 3c may be arranged on an electrically-insulating layer that is arranged on the crystalline oxide semiconductor film 1. The semiconductor device 600 may be a transistor, for example, the first electrode 3a may be may be a source electrode, the second electrode 3b may be a drain electrode, and the third electrode 3c may be a gate electrode.

Figure 13A:
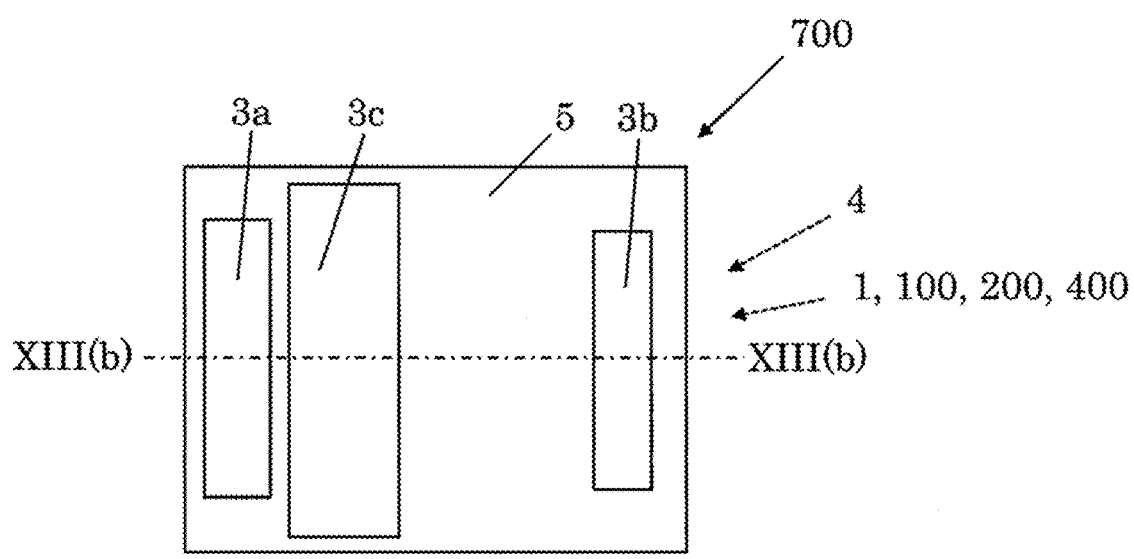
FIG. 13A shows a schematic top plan view of a semiconductor device according to a seventh embodiment of a present inventive subject matter.
Figure 13B:
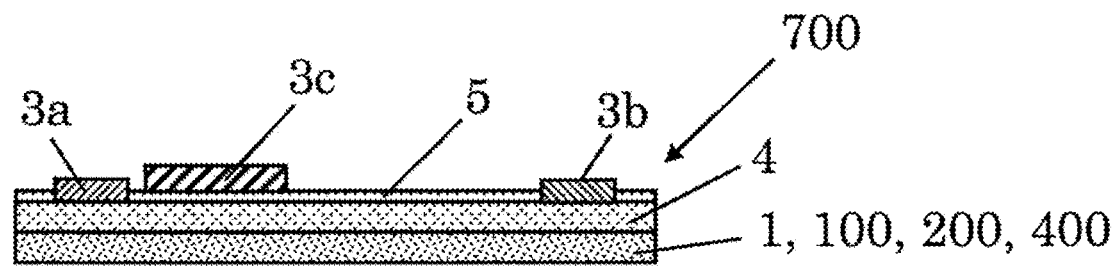
FIG. 13B shows a schematic cross-sectional view of a semiconductor device taken along a dash-dotted line XIII(b)-XIII(b) shown in FIG. 13A

FIG. 13A shows a schematic top plan view of a semiconductor device according to a seventh embodiment of a present inventive subject matter. FIG. 13B shows a schematic cross-sectional view of a semiconductor device taken along a dash-dotted line XIII(b)-XIII(b) shown in FIG. 13A A crystalline oxide film 1 of this embodiment contains gallium oxide with a corundum structure and includes an r-plane as a principal plane. The crystalline oxide film 1 has a full width at half maximum (FWHM) of rocking curve that is 0.1° or less by ω-scan X-ray diffraction (XRD) measurement. Also, the crystalline oxide film 1 was formed to be electrically-insulative without impurity atoms as a dopant being doped in the crystalline oxide film 1.

The semiconductor device 700 includes the crystalline oxide film 1 that is electrically-insulative and a semiconductor 4 arranged on the crystalline oxide film 1, a first electrode 3a that is electrically connected to the semiconductor 4 and a second electrode 3b that is electrically connected to the semiconductor 4. The semiconductor 4 may be a crystalline oxide semiconductor film. Also, the semiconductor 4 may be a layered structure includes a layered structure with a semiconductor property. Furthermore, the semiconductor 4 may be a layered structure partially including an electrically-insulative portion or including an electrically-insulative layer. Furthermore, the first electrode 3a and the second electrode 3b may be arranged at a same side of the semiconductor 4. Also, the first electrode 3a may be arranged adjacent to a first side of the semiconductor 4 and the second electrode 3b may be arranged adjacent to a second side that is an opposite side of the first side of the semiconductor 4.

Figure 14A:
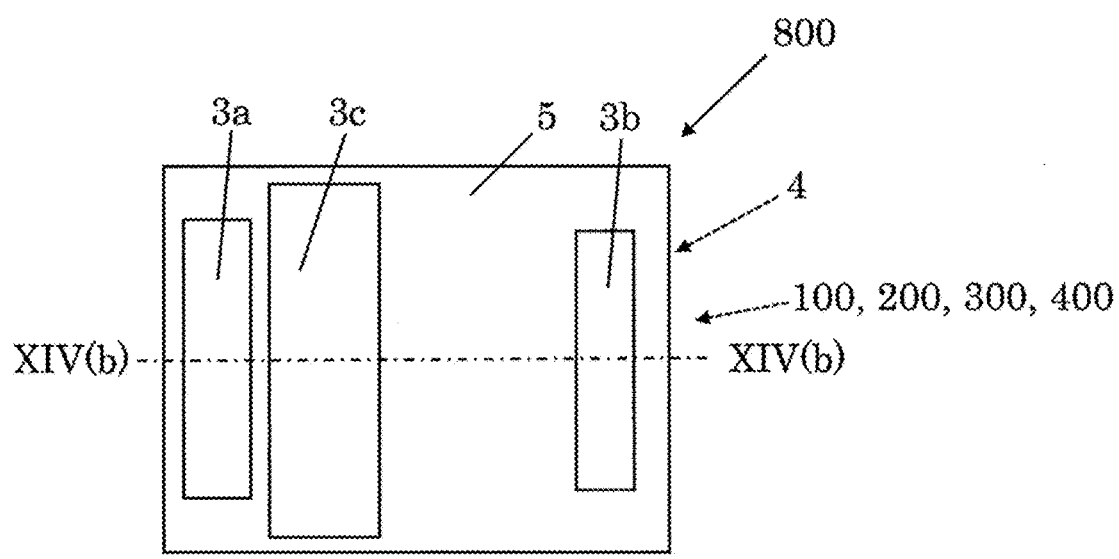
FIG. 14A shows a schematic top plan view of a semiconductor device according to a ninth embodiment of a present inventive subject matter.
Figure 14B:
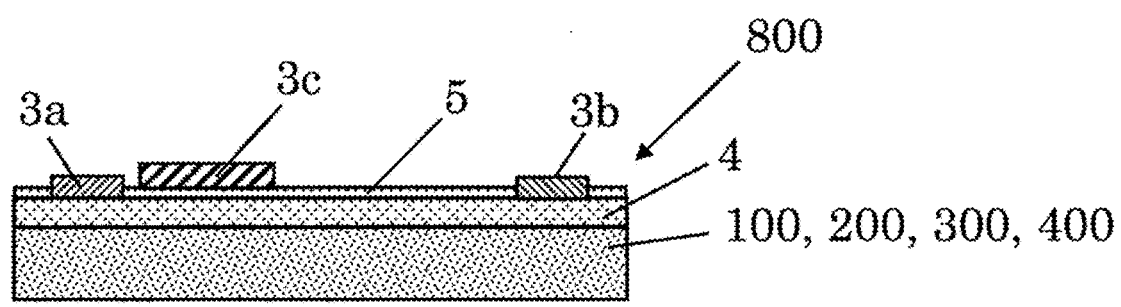
FIG. 14B shows a schematic cross-sectional view of a semiconductor device taken along a dash-dotted line XIV(b)-XIV(b) shown in FIG. 14A

FIG. 14A shows a schematic top plan view of a semiconductor device according to a ninth embodiment of a present inventive subject matter. FIG. 14B shows a schematic cross-sectional view of a semiconductor device taken along a dash-dotted line XIV(b)-XIV(b) shown in FIG. 14A.

The semiconductor device 800 includes at least a first layer and a second layer arranged on the first layer. The first layer 1 contains gallium oxide with a corundum structure and has a full width at half maximum (FWHM) of rocking curve that is 0.1° or less by ω-scan X-ray diffraction (XRD) measurement. Also, the first layer 1 is a crystallized film without impurity atoms as a dopant being doped, and the first layer 1 is electrically-insulative. The first layer 1 has an r-plane as a principal plane. The second layer 2 has an r-plane as a principal plane. The layered structure of the semiconductor device 800 may be a superlattice. Also, the layered structure may be used as a buffer layer on that a semiconductor is grown. The lattice mismatch between $\alpha$-$Al_2O_3$ (sapphire) and $\alpha$-$Ga_2O_3$ is known to be as large as 3.2% to 4.5%, however, according to an embodiment of a present inventive subject matter, a layered structure with which a superlattice peak was able to be confirmed was obtained, even if a sapphire substrate is used as a base layer. The layered structure of the semiconductor device 800 includes a first layer 1 containing gallium oxide with a corundum structure and a second layer 2 containing aluminum oxide with a corundum structure. The first layer 1 is a coherent layer that is coherently grown from the second layer 2. A semiconductor that is grown on the layered structure with a superlattice is affected by the superlattice to be better lattice-matched. The semiconductor may be grown as a single layer, and also as a layered structure including two or more layers. The semiconductor device 800 includes the layered structure with a superlattice that may be electrically-insulative, the semiconductor arranged on the layered structure, the first electrode electrically connected to the semiconductor, and the second electrode electrically connected to the semiconductor.

Figure 15:
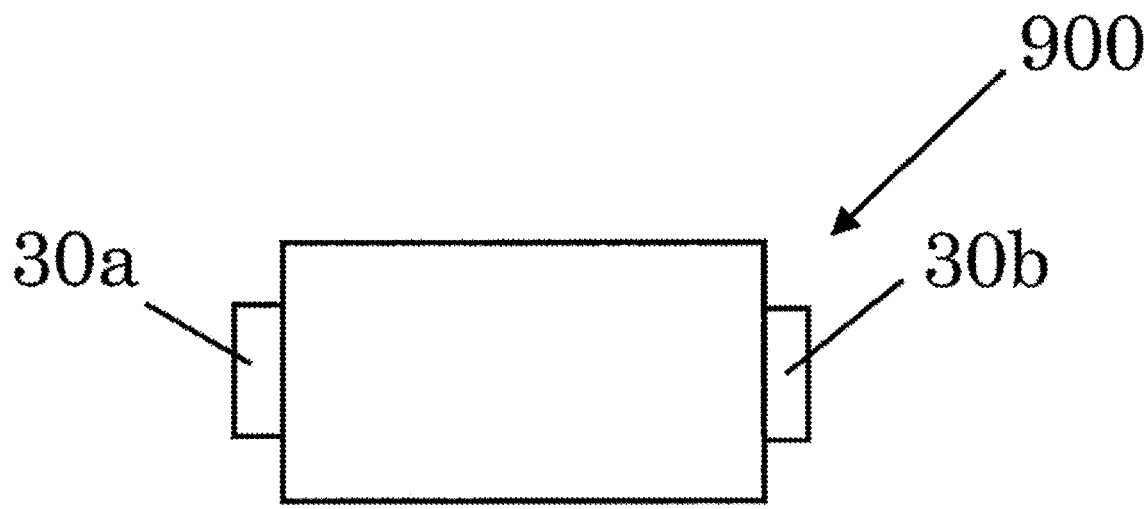
FIG. 15 shows a schematic top plan view of a semiconductor device according to a tenth embodiment of a present inventive subject matter.

FIG. 15 shows a schematic top plan view of a semiconductor device according to a tenth embodiment of a present inventive subject matter. The semiconductor device 900 includes a crystalline oxide semiconductor layer and/or a layered structure according to an embodiment of the layered structure of a present inventive subject matter. Examples of the semiconductor device 900 include a diode, a semiconductor laser, and a transistor such as a metal-oxide-semiconductor field-effect transistor (MOSFET) or a high-electron-mobility transistor (HEMT) or a thin-film transistor (TFT). Also, the semiconductor device 900 may be a Schottky diode formed by the junction of a semiconductor with a metal. Furthermore, the semiconductor device 900 including one or more p-type layer is applicable to a PN diode or PIN diode. Also, the semiconductor device 900 is applicable to a Junction Barrier Schottky (JBS) and other semiconductor devices including a light-emitting and/or light-receiving device.

Figure 21:
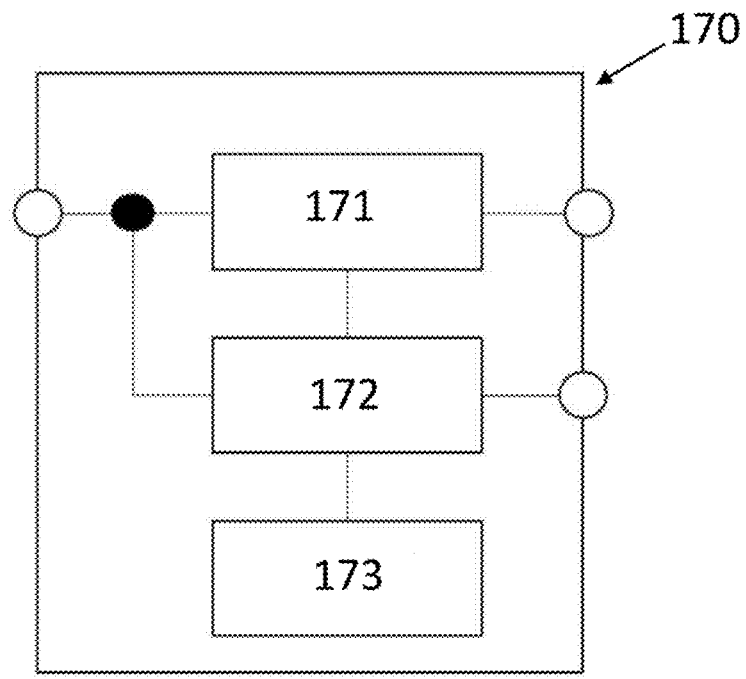
FIG. 21 shows a schematic view of a semiconductor system according to an eighth embodiment of a present inventive subject matter.

The semiconductor device according to an embodiment of a present inventive subject matter may be used in various systems including an automotive radar, an antenna, a car navigation system, and a base station system for communication, for example. Also, the semiconductor device may be used in a power system by electrically connecting the semiconductor device and a circuit board of the power system. For example, FIG. 21 shows a schematic view of a semiconductor system according to an eighth embodiment of a present inventive subject matter. The semiconductor system may be a power system 170. The power system 170 may include a semiconductor device as a power device. The semiconductor device further includes a first electrode electrically connected to the first semiconductor layer; and a second electrode electrically connected to the first semiconductor layer.

Also, the power system 170 may include two or more power devices and a control circuit. The power system 170 shown in FIG. 21 includes a first power system 171 and a second power system 172 and a control circuit 173 that are electrically connected to one another in the power system 170.

Figure 22:
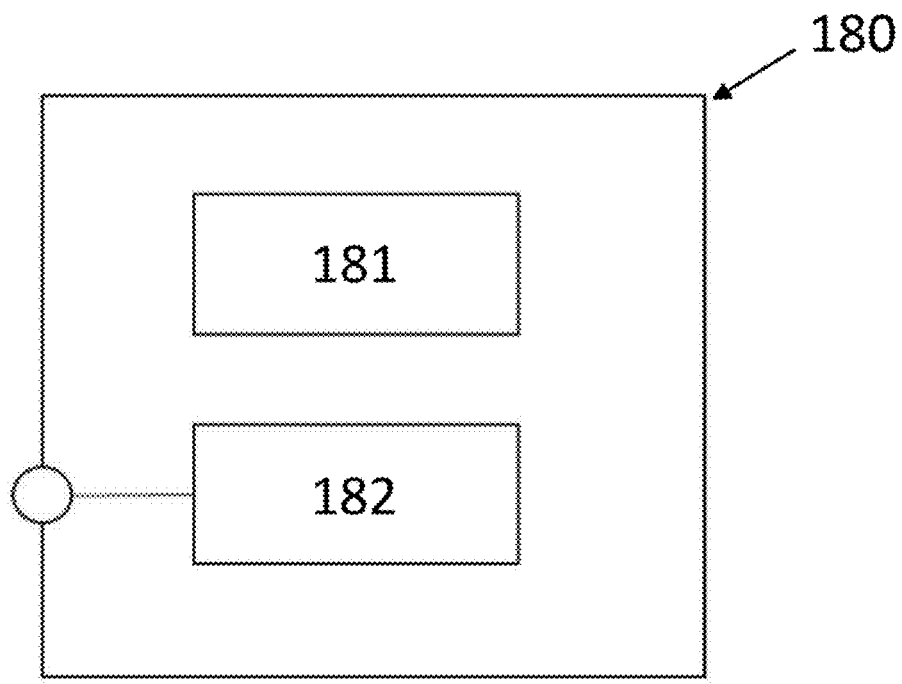
FIG. 22 shows a schematic view of a semiconductor system according to an embodiment of a present inventive subject matter.

FIG. 22 shows a schematic view of a semiconductor system according to an embodiment of a present inventive subject matter. The semiconductor system may be a system device 180, as shown in FIG. 22. The system device 180 may include a power system 181 and an electric circuit 182 that may be combined with the power system 181.

Figure 23:
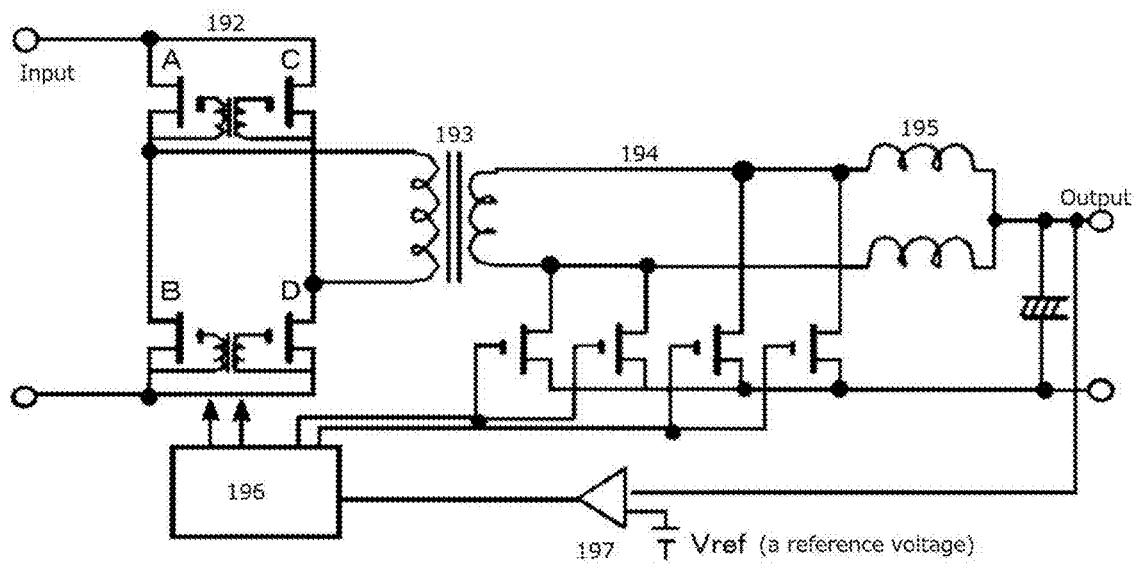
FIG. 23 shows a schematic diagram of a semiconductor system according to a tenth embodiment of a present inventive subject matter.

FIG. 23 shows a schematic diagram of a semiconductor system according to a tenth embodiment of a present inventive subject matter. FIG. 23 illustrates a power supply circuit 191 of a power supply device, including a power circuit and a control circuit. A DC voltage is switched at high frequencies by an inverter 192 (configured with MOSFET A to D) to be converted to AC, followed by insulation and transformation by a transformer 193. The voltage is then rectified by rectification MOSFETs 194 and then smoothed by a DCL 195 (smoothing coils L1 and L2) and a capacitor to output a direct current voltage. At this point, the output voltage is compared with a reference voltage by a voltage comparator 197 to control the inverter and the rectification MOSFETs by a PWM control circuit 196 to have a desired output voltage.

FIG. 15 shows a schematic top plan view of a semiconductor device according to a tenth embodiment of a present inventive subject matter. The semiconductor device 900 is electrically mounted on a circuit substrate 1000 of a power control system. The semiconductor device 900 includes a casing, a first terminal electrode 30a partly positioned outside the casing, and a second terminal electrode 30b partly positioned outside the casing. The first terminal electrode 30a of the semiconductor device 900 may be electrically connected to a first electrode of the circuit substrate 1000 of the power control system with solder, for example. The second terminal electrode 30b of the semiconductor device 900 may be electrically connected to a second electrode of the circuit substrate 1000 of the power control system with solder, for example. Also, the first terminal electrode 30a may be a part of a lead frame, and the second terminal electrode 30b may be a part of a lead frame. Also, the semiconductor device 900 may include a drive circuit to be a module. The number of electrode terminals, positions of the electrode terminals, shapes of the electrode terminals may be freely selectable to design semiconductor devices.

Figure 16:
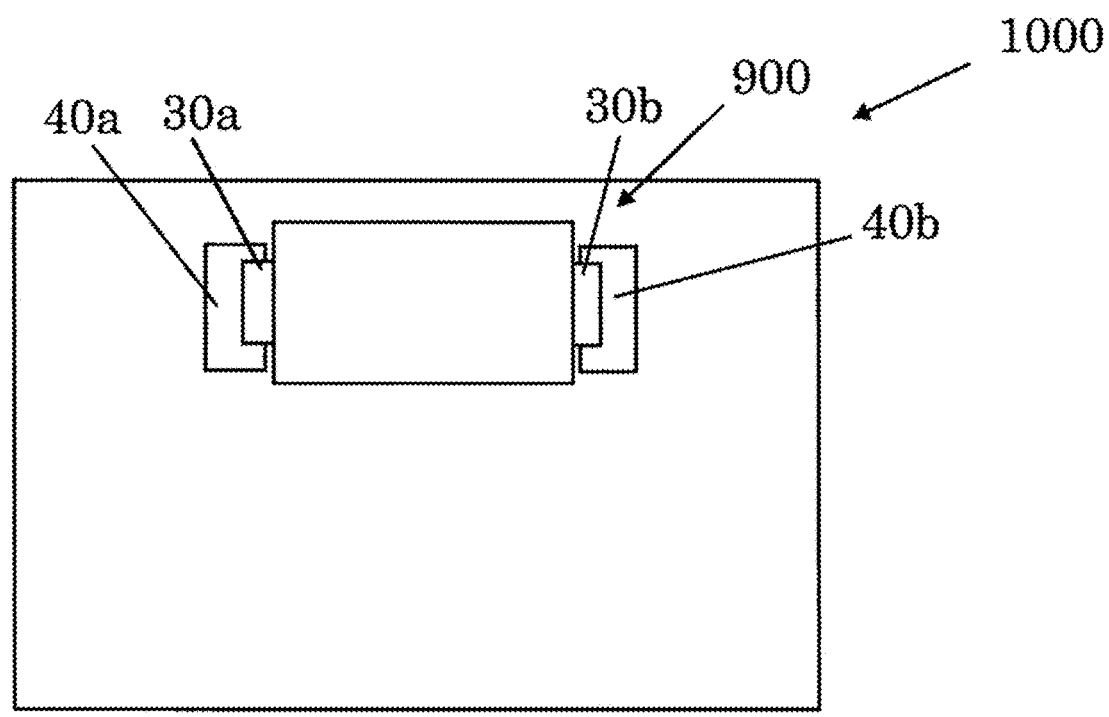
FIG. 16 shows a circuit substrate on that a semiconductor device of a present inventive subject matter is electrically mounted.

FIG. 16 shows a circuit substrate on that a semiconductor device of a present inventive subject matter is electrically mounted. The circuit substrate shown in FIG. 16 may be a motherboard of a system, for example. The system may be an electronic device. Examples of the system include a personal computer, an electronic appliance, a portable electronic device, a lighting system, and a power system, an automatic operating system, an automatic driving system, a network operating system, and a part thereof.

Figure 17:
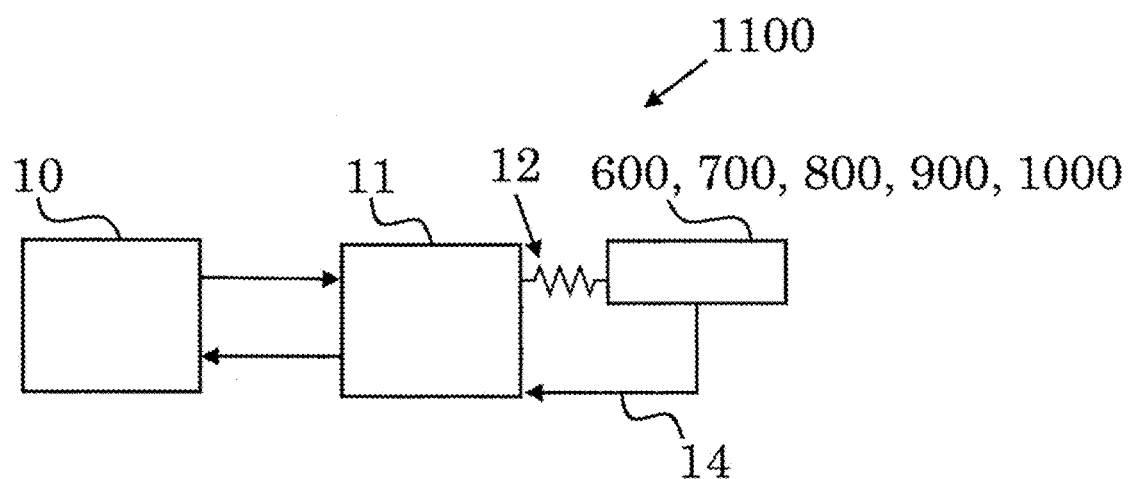
FIG. 17 shows a schematic diagram of a system in that a drive circuit connected to a semiconductor device according to an embodiment of a present inventive subject matter.

FIG. 17 shows a schematic diagram of a system in that a driving circuit connected to a semiconductor device according to an embodiment of a present inventive subject matter. The system may include a semiconductor device 600, 700, 800, 900, or 1000 according to an embodiment of a present inventive subject matter and a microcomputer configured to turn on or off of the semiconductor device using signals. The system 1000 may include a resistor electrically arranged between the drive circuit 11 and the semiconductor device. Voltage output from the drive circuit is transmitted through a resistor 12 to the semiconductor device, and electric current detected from the semiconductor device is transmitted to the drive circuit as a signal 14. Also, a semiconductor device according to an embodiment of a present inventive subject matter, the semiconductor device is used in the above-mentioned electronic device, electronic appliance, and applicable to an inverter, and also arranged in a circuit of devices and used in various systems such as a transportation system and a power generating system.

Figure 18:
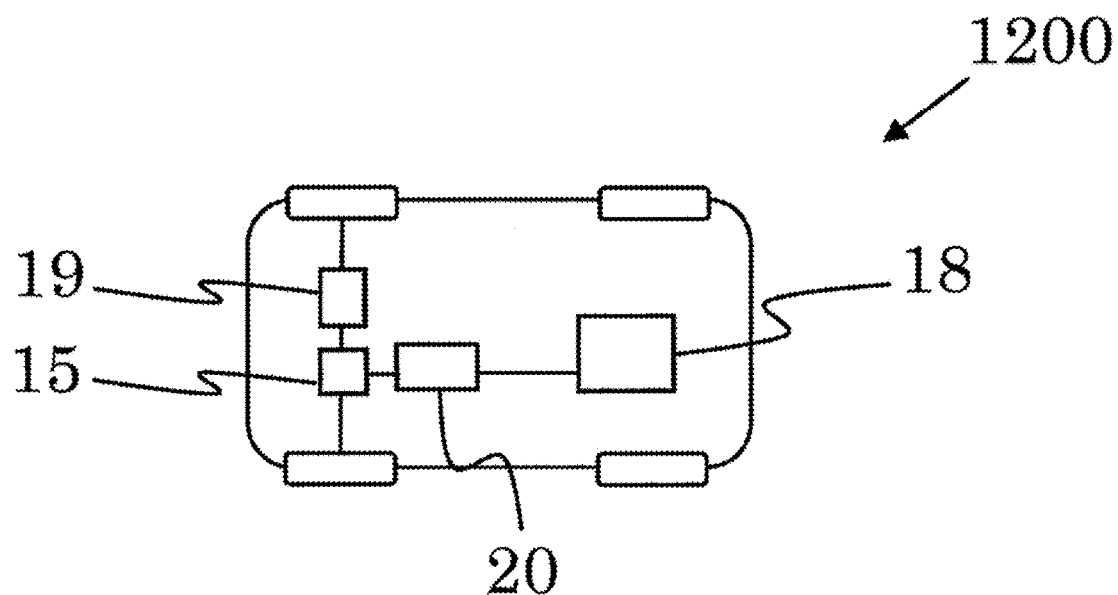
FIG. 18 shows a schematic diagram showing a system including a semiconductor device of a present inventive subject matter.

FIG. 18 shows a schematic diagram showing a system including a semiconductor device of a present inventive subject matter, showing a transportation system, for example. The transportation system 1200 includes a power control device 20 including a semiconductor device according to a present inventive subject matter. The semiconductor device in the power control device 20 may be an inverter and is electrically connected to a motor 15. Also, the transportation system 1200 may include a driving battery 18 electrically connected to the semiconductor device in the power control device 20. The transportation system 1200 may further include an automotive transmission 19. The transportation system 1200 may include a computer connected to the power control device 20 and may be connected to the network system. Examples of the transportation system include a device to transport and/or cargo. Examples of the device include automobiles, trains, planes, ships and unmanned aerial vehicles.

Next, an MBE method is explained as a method of forming a crystalline oxide film (layer) and/or a layered structure. A sapphire substrate with an r-plane as a principal plane (r-plane sapphire substrate) is arranged in an MBE apparatus 1300 including two or more cells. The sapphire substrate may be held to face the two or more cells of the MBE apparatus. The two or more cells of the MBE apparatus include a first cell from which metal gallium is vaporized and supplied to the sapphire substrate, and a radical cell from which radical oxygen is supplied to the sapphire substrate. Vaporized gallium simultaneously supplied with radical oxygen to the sapphire substrate with the r-plane as the principal plane forms a film containing gallium oxide with a corundum structure as a first layer. In the MBE method, a crystalline oxide film containing gallium oxide with a corundum structure is more stably obtainable to have an enhanced electrical property on an r-plane sapphire substrate than on a c-plane sapphire substrate.

The two or more cells of the MBE apparatus further include a second cell from which metal aluminum is vaporized and supplied to the first layer on the r-plane sapphire substrate, and a radical cell from which radical oxygen that is simultaneously supplied to the first layer containing gallium oxide with the corundum structure on the r-plane sapphire substrate to form a film containing aluminum oxide with a corundum structure as a second layer on the first layer.

Furthermore, vaporized gallium simultaneously supplied with radical oxygen to the second layer to form a film containing gallium oxide with a corundum structure as a first layer is formed on the second layer containing aluminum oxide with a corundum structure. Accordingly, layers as the first layer and layers as the second layer are stacked alternately on the r-plane sapphire substrate to form a superlattice above the sapphire substrate.

Also, according to an embodiment of a present inventive subject matter, the first layer containing gallium oxide and including an r-plane as a principal plane may be formed to be 1 nm or less in thickness by the MBE method. Furthermore, it is possible to form the first layer to be more than 1 nm in thickness by the MBE method. The first layer may contain a mixed crystal containing gallium oxide.

The temperature of the sapphire substrate is set to be in a range of 550° C. to 600° C.

According to an embodiment of a layered structure of a present inventive subject matter, a layered structure indicated as A, a layered structure indicated as B, and a layered structure indicated as C were formed by a radical source MBE method. The thickness of the layers as the first layer containing gallium oxide with a corundum structure is used as a parameter to confirm the relationship of the thickness of the first layer and crystallinity of the layered structures A, B, and C each with ten cycles of alternately stacking layers as the second layer and layers as the first layer. The layers as the first layer were $\alpha$-$Ga_2O_3$ layers and the layers as the second layer were $\alpha$-$Al_2O_3$ layers. The first layer of the layered structure A was 0.45 nm in thickness and the second layer of the layered structure A was 5.80 nm in thickness. The first layer of the layered structure B was 0.95 nm in thickness, and the second layer of the layered structure B was 6.12 nm in thickness. The first layer of the layered structure C was 1.28 nm in thickness, and the second layer of the layered structure B was 5.97 nm in thickness.

TABLE 1

| Layered structure A | Layered structure B | Layered structure C |
| --- | --- | --- |
| a superlattice peak was confirmed a coherent film was confirmed | a superlattice peak was confirmed a coherent film was confirmed | a peak shape was confirmed a coherent film was unconfirmed |

Figure 9:
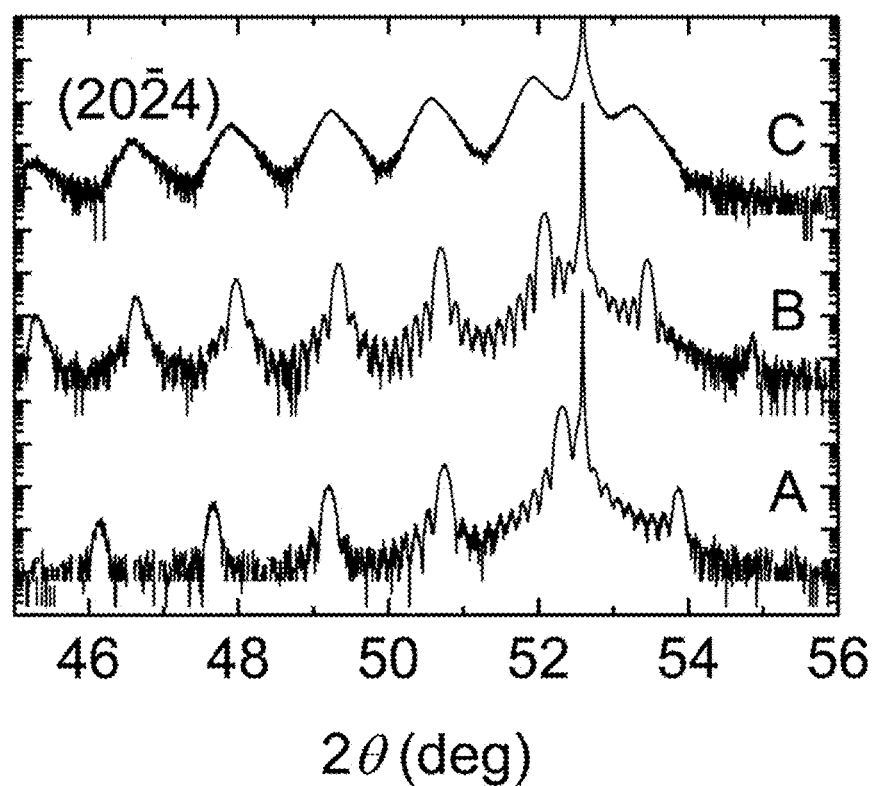
FIG. 9 shows a symmetric XRD pattern of a layered structure indicated as A in FIG. 9, a symmetric XRD pattern of a layered structure indicated as B in FIG. 9, and a symmetric XRD pattern of a layered structure indicated as C in FIG. 9. The horizontal axis indicates an angle of diffraction (deg.) and the vertical axis indicates an intensity of diffraction (arb. units).
Figure 10:
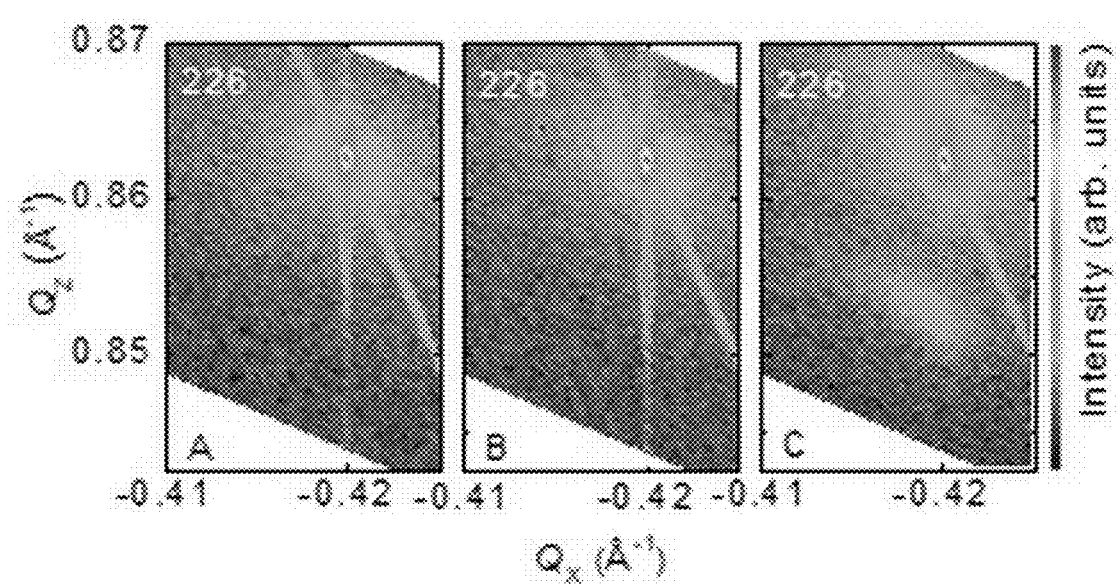
FIG. 10 shows asymmetric reciprocal lattice maps of the layered structure indicated as A in FIG. 10, the layered structure indicated as B in FIG. 10 and the layered structure indicated as C in FIG. 10.

FIG. 9 shows a symmetric XRD pattern of the layered structure A indicated as A in FIG. 9, a symmetric XRD pattern of the layered structure indicated as B in FIG. 9, and a symmetric XRD pattern of the layered structure indicated as C in FIG. 9. The horizontal axis indicates an angle of diffraction (deg.) and the vertical axis indicates an intensity of diffraction (arb. units). The layered structure A was easily confirmed with a superlattice peak by the symmetric XRD pattern, showing high crystallinity. Also, the layered structure B was easily confirmed with a superlattice peak by the symmetric XRD pattern, showing high crystallinity. The layered structure C was confirmed to have a peak shape, however, the layered structure A and the layered structure B were observed with much higher crystallinity than the layered structure C. Also, FIG. 10 shows asymmetric reciprocal lattice maps of the layered structure indicated as A, the layered structure indicated as B and the layered structure indicated as C. FIG. 10 shows that the first layers and the second layers that are alternately stacked on the sapphire substrate of the layered structure A are formed with coherent lattice. Also, FIG. 10 shows that the first layers and the second layers that are alternately stacked on the sapphire substrate of the layered structure B are formed with coherent lattice. As an embodiment of a layered structure, layers as the first layer may be set to be 1 nm or less. Also, according to another embodiment of a present inventive subject matter, the first layer may contain a mixed crystal. Even if layers as the first layer are increased in thickness, a layered structure with a superlattice peak is expected to be obtained by changing ratio of components as a mixed crystal contained in the layers of the layered structure, for example.

Figure 19:
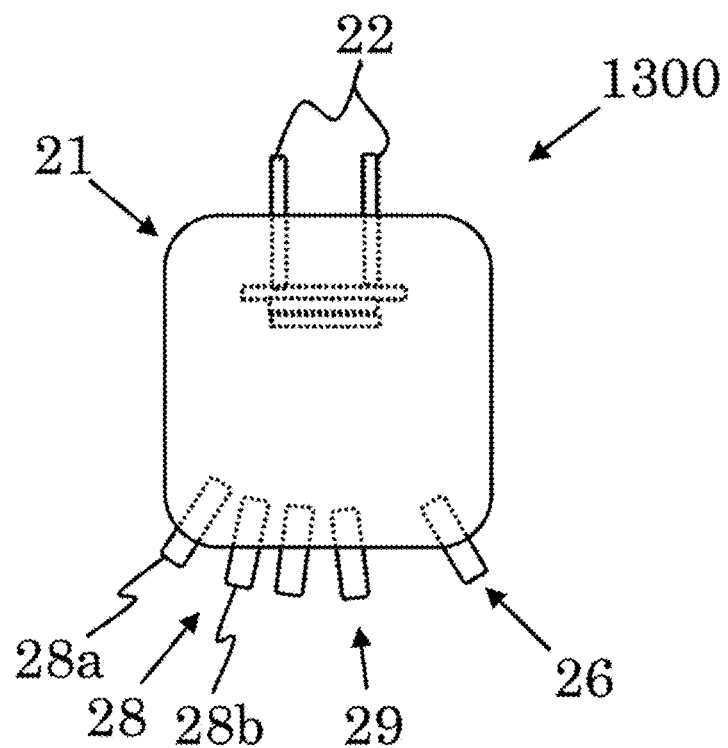
FIG. 19 shows a film (layer)-formation apparatus using a molecular beam epitaxy (MBE) method.

FIG. 19 shows a film (layer)-formation apparatus using a molecular beam epitaxy (MBE) method. The MBE apparatus 13 includes a vacuum chamber 21, a substrate 24 containing aluminum oxide with a corundum structure and including an r-plane as a principal plane (r-plane sapphire substrate) held by a substrate holder 23 in the vacuum chamber 21. The MBE apparatus further includes a heating device 22 to heat the substrate 24 held by the substrate holder 23, at least one cell 28 in that metal material(s) to form a first film containing gallium oxide with a corundum structure is set as a first cell 28a, and at least one cell 29 in that metal material(s) to form a second film containing aluminum oxide with a corundum structure, and a radical cell from which radical oxygen is supplied to the sapphire substrate. The MBE apparatus 1300 includes a vacuum pump to discharge air from the vacuum chamber 21, a heater to heat the cells. The substrate holder 11 to hold the substrate may be configured to rotate with a shaft, for example.

After the gas pressure becomes stable, heating the first cell by a heater to vaporize metal material(s) and vaporized metal material(s) are irradiated to the r-plane sapphire substrate as a molecular beam while radical oxygen is simultaneously supplied from the oxygen radical cell to the r-plane sapphire substrate. Accordingly, a first layer containing gallium oxide with a corundum structure is formed on the r-plane sapphire substrate.

Also, the first cell may include a cell 28b in that impurity atoms as a dopant are contained. The first cell group including the first cell and the cell containing the dopant by the heater to vaporize the dopant and metal material(s). The vaporized dopant and metal material(s) may be irradiated as a molecular beam onto a surface of the substrate while radical oxygen is simultaneously supplied with the vaporized dopant and metal material(s) to the surface of the substrate to form the first layer as a semiconductor film, for example. Also, depending on a material of the cells containing raw material(s) for example, such a component originated from the apparatus may enter the film while being formed and may unexpectedly work as a dopant.

Next, the second cell is heated by a heater to form a second film containing aluminum oxide on the first layer positioned on the r-plane substrate.

As mentioned above, a layered structure is obtained by alternately stacking layers as the first layer and layers as the second layer on the r-plane substrate by use of the MBE method. The layered structure on that a crystalline oxide semiconductor film containing gallium oxide with a corundum structure and including an r-plane as a principal plane may be formed is obtained. The crystalline oxide film directly on the base layer or through at least one layer that is arranged adjacent to the base layer, and the crystalline oxide film with a full width at half maximum (FWHM) of rocking curve that is 0.1° or less by ω-scan X-ray diffraction (XRD) measurement. The layered structure may be used as a buffer layer as a whole of the layered structure, or may be used as a buffer layer partly taken from the layered structure as a layer or a thinner layered structure.

According to a present inventive subject matter, it is possible to form a layered structure with a superlattice by alternately depositing layers as the first layer and layers as the second layer using a base layer containing aluminum oxide and including an r-plane as a principal plane by the MBE method and also by the mist CVD method. In particular, the MBE method is good at growing crystalline oxide layers each with an r-plane as a principal plane and adjusting layer (film) thickness, and thus, the MBE method appears to be more suitable to form a layered structure with a superlattice.

According to an embodiment of a present inventive subject matter, it is also preferable to form a film or a layered structure in good quality without a crystal dislocation such as a misfit dislocation by use of the MBE method, and to form a crystalline oxide film on the layered structure by use of a different method from the MBE, for example, the mist CVD method. The mist CVD method is more suitable to form a crystalline oxide film with increased thickness, compared with the MBE method.

Figure 20:
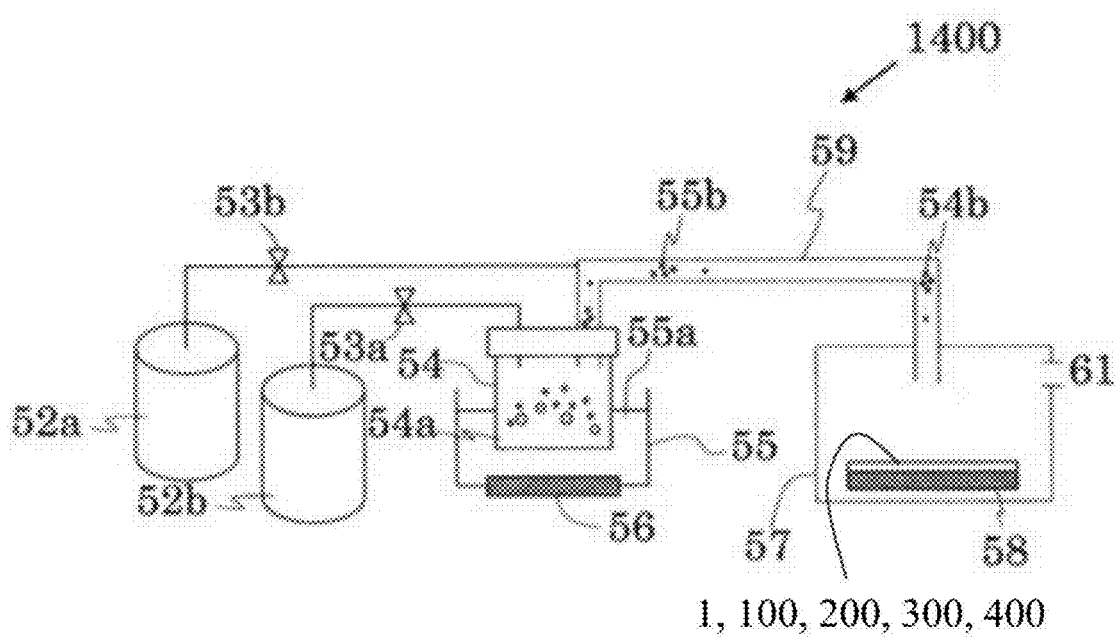
FIG. 20 shows a film (layer)-formation apparatus using a mist CVD method.

FIG. 20 shows a layer (film)-formation apparatus using a mist chemical vapor deposition (CVD) method. after a layered structure is formed by depositing layers on a substrate with a corundum structure and an r-plane as a principal plane.

FIG. 20 shows a schematic view of a mist CVD apparatus 1400 used in this example to form a crystalline oxide semiconductor layer (film) on a layered structure that is obtained by use of an MBE method or a layered structure that is obtained by use of an MBE method. It is possible to obtain a semiconductor film by separating at least an object, for example. The mist CVD apparatus 1400 includes a carrier gas supply device 52a, a first flow-control valve 53a to control a flow of a carrier gas that is configured to be sent from the carrier gas supply device 52a, a diluted carrier gas supply device 52b, a second flow-control valve 53b to control a flow of a carrier gas that is configured to be sent from the diluted carrier gas supply device 52b, a mist generator 54 in that a raw material solution 54a is contained, a container 55 in that water 55a is contained, and an ultrasonic transducer 56 that may be attached to a bottom surface of the container 55. The mist CVD apparatus 1400 further includes a layer (film)-formation chamber 57, a supply tube 59 connecting the mist generator 54 to the layer (film)-formation chamber 57, a hot plate 58, and an exhaust port 61 to release atomized droplets and gas after the layer (film) is formed. The hot plate 58 is arranged in the layer (film)-formation chamber 57. A layer (film) is grown on an object 20 arranged on the hot plate 28. The object 20 may be a base. Also, the object may be a layered structure according to an embodiment of a present inventive subject matter. The layer (film) may be grown on a first layer or a second layer of the layered structure.

(Forming Atomized Droplets from a Raw Material Solution)

A raw material solution containing a metal is prepared, and the mixing ratio of the metal in the entire raw material solution is not particularly limited, however, preferably in a range of 0.0001 mol/L to 20 mol/L. Using the mist CVD method according to an embodiment of a present inventive subject matter, the mixing ratio of the metal in the entire raw material solution is further preferably in a range of 0.01 mol/L to 1 mol/L. The raw material solution is turned into atomized droplets floating in a space of a container of a mist generator. The raw material solution may be turned into atomized droplets by a known method, and the method is not particularly limited, however, according to an embodiment of a present inventive subject matter, the raw material solution is preferably turned into atomized droplets by ultrasonic vibration. Atomized droplets including mist particles and obtained by using ultrasonic vibration and floating in the space have the initial velocity that is zero. Since atomized droplets floating in the space are carriable as a gas, the atomized droplets floating in the space are preferable to avoid damage caused by the collision energy without being blown like a spray. The size of droplets is not limited to a particular size, and may be a few mm, however, the size of atomized droplets is preferably 50 μm or less. The size of droplets is preferably in a range of 0.1 μm to 10 μm.

(Forming a Layer)

For forming a crystalline oxide film by the mist CVD method, the atomized droplets carried into the layer (film)-formation chamber by carrier gas are thermally reacted (through "thermal reaction") to form a semiconductor layer on a base that is arranged in the layer (film)-formation chamber. The first semiconductor layer and the second semiconductor layer may be formed similarly as a semiconductor layer. Herein, "thermal reaction" works as long as the atomized droplets react by heat, and thus, the term "thermal reaction" herein may include a chemical reaction, and/or a physical reaction. The "thermal reaction" herein may include another reaction, and conditions of reaction are not particularly limited as long as an object of a present inventive subject matter is not interfered with. According to embodiments of a present inventive subject matter, the thermal reaction is conducted at an evaporation temperature or higher temperatures of the evaporation temperature of the solvent of the raw material solution, however, a range of temperature for the "thermal reaction" are not too high and may be preferably conducted at a temperature in a range of 300° C. to 600° C. Also, the thermal reaction may be conducted in any atmosphere of a vacuum, a non-oxygen atmosphere, a reducing-gas atmosphere, and an oxidizing-gas atmosphere. Also, the thermal reaction may be conducted in any condition of under an atmospheric pressure, under an increased pressure, and under a reduced pressure. According to embodiments of a present inventive subject matter, the thermal reaction is preferably conducted under an atmospheric pressure. Also, a layer (film) thickness of crystalline oxide semiconductor layer (film) is able to be set by adjusting a layer (film)-formation time, the temperature at the thermal reaction, and flow rate of gas, for example.

According to embodiments of a present inventive subject matter, a film or a layered structure that is obtained by the MBE method may be used as a buffer layer, and a crystalline oxide semiconductor layer containing impurity atoms as a dopant is formed on the buffer layer by the mist CVD method, however, it is also possible to use as a buffer layer a film or a layered structure that is obtained by the mist CVD method.

Furthermore, according to an embodiment of a present inventive subject matter, it is also possible to form a layered structure with a superlattice and a crystalline oxide semiconductor film on the layered structure by use of the MBE method, however, forming the crystalline oxide semiconductor film by use of the mist CVD method is further preferable. For more details, the method including generating atomized droplets from a raw material solution, carrying the atomized droplets by carrier gas onto a surface of the layered structure, and causing thermal reaction of the atomized droplets adjacent to the surface of the layered structure as a buffer layer is further preferable.

Also, the thickness of a crystalline oxide semiconductor film formed by a mist CVD method is not particularly limited, however, according to an embodiment of a present inventive subject matter, the crystalline oxide semiconductor film is preferably 1 μm or more in thickness, and further preferably 3 μm or more in thickness. A crystalline oxide semiconductor layer obtained by the mist CVD method on a layered structure that is obtained by the MBE method is usually a single crystal layer. A method of forming a crystalline oxide semiconductor film by the mist CVD method includes generating atomized droplets by atomizing a raw material solution, carrying the atomized droplets by carrier gas onto a base, and causing a thermal reaction of the atomized droplets.

A layered structure according to a present inventive subject matter may be used as a layered structure including a crystalline oxide semiconductor layer in a semiconductor device. Also, the layered structure may be partly removed to obtain a crystalline oxide semiconductor layer. According to an embodiment of a present inventive subject matter, a layered structure may be formed by depositing layers by the MBE method. Also, the layered structure may include at least one layer of layers deposited by a mist CVD method. The at least one layer may be a crystalline oxide semiconductor layer.

According to an embodiment of a present inventive subject matter, a crystalline oxide semiconductor film contains at least one crystalline oxide semiconductor selected from a crystalline oxide semiconductor containing gallium oxide as a major component and a crystalline oxide semiconductor containing as a major component a mixed crystal that contains gallium oxide with a corundum structure. The crystalline oxide semiconductor film is an r-plane crystalline oxide semiconductor film with a full width at half maximum (FWHM) of rocking curve that is 0.1° or less by ω-scan X-ray diffraction (XRD) measurement. Also, the crystalline oxide semiconductor film is with electrical resistivity that is 0.1 Ωcm or less.

Also, a layered structure according to an embodiment of a present inventive subject matter is available to obtain a crystalline oxide semiconductor film that is used in semiconductor devices and/or systems, electronic parts and/or devices, optical products, photoelectric devices, industrial parts, devices, and/or systems.

Accordingly, the crystalline oxide film, the layered structure, the semiconductor device, and/or semiconductor system according to a present inventive subject matter is expected to be used for various purposes.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

REFERENCE NUMBER DESCRIPTION 1 a first film (a first layer)
2 a second film (a second layer)
3a a first electrode
3b a second electrode
3c a third electrode
3 a third layer
4 a semiconductor
5 an electrically-insulating layer
10 a microcomputer
11 a drive circuit
12 a resistor
14 a signal
15 a motor
18 a driving battery
19 a transmission
20 a power control device
21 a vacuum chamber
22 a heater
26 a radical cell
28 a first cell
29 a second cell
30a a first terminal electrode
30b a second terminal electrode
40a a first electrode of a motherboard
40b a second electrode of a motherboard 19 a layer (film)-formation apparatus
20 an object on which a film is to be formed
52a a carrier gas supply device
52b a diluted carrier gas supply device
53a a flow-control valve of carrier gas
53b a flow-control valve of diluted carrier gas
54 a mist generator
54a a raw material solution
54b an atomized droplet
55 a vessel
55a water
56 an ultrasonic transducer
57 a layer (film)-formation chamber
58 a hot plate
59 a supply tube
30 an exhaust port
100 a layered structure
200 a layered structure
300 a layered structure
400 a layered structure
500 a semiconductor device
600 a semiconductor device
700 a semiconductor device
800 a first semiconductor device
900 a semiconductor device
1000 a semiconductor device
1200 a transportation system
1300 an MBE apparatus
1400 a mist CVD apparatus

What is claimed is:

1. A layered structure comprising:
a base layer; and
a crystalline oxide film comprising a corundum structure and comprising an r-plane as a principal plane, the crystalline oxide film directly on the base layer or through at least one layer that is adjacently arranged to the base layer, and the crystalline oxide film with a full width at half maximum (FWHM) of rocking curve that is 0.1° or less by ω-scan X-ray diffraction (XRD) measurement.

2. The layered structure of claim 1, wherein
the crystalline oxide film is a coherent layer that is coherently grown from the base layer or coherently grown from the at least one layer that is adjacently arranged to the base layer.

3. The layered structure of claim 1, wherein
the crystalline oxide film is a semiconductor film.

4. The layered structure of claim 1, wherein
the crystalline oxide film comprises gallium oxide as a major component.

5. The layered structure of claim 1, wherein
the crystalline oxide film comprises as a major component a mixed crystal comprising gallium oxide.

6. The layered structure of claim 1, wherein
the at least one layer that is adjacently arranged to the base layer comprises a crystalline oxide film comprising aluminum oxide as a major component.

7. The layered structure of claim 6,
wherein the first composition of the first layer is a crystalline oxide comprising gallium oxide as a major component.

8. The layered structure of claim 7,
the crystalline oxide film is with electrical resistivity that is 0.1 Ωcm or less.

9. The layered structure of claim 6,
wherein the first composition of the first layer is a crystalline oxide comprising as a major component a mixed crystal that comprises gallium oxide.

10. The layered structure of claim 6,
wherein the second composition of the second layer is a crystalline oxide comprising aluminum oxide as a major component.

11. The layered structure of claim 6,
wherein the second composition of the second layer is a crystalline oxide comprising as a major component a mixed crystal comprising aluminum oxide.

12. The layered structure of claim 1, wherein
the at least one layer that is adjacently arranged to the base layer comprises a crystalline oxide film comprising as a major component a mixed crystal comprising aluminum oxide.

13. A semiconductor device comprising:
the layered structure of claim 1 comprising a first side and a second side that is an opposite side of the first side;
a first electrode positioned at the first side of the layered structure; and
a second electrode positioned at the first side of the layered structure and spaced from the first electrode.

14. A layered structure comprising:
a first layer with a first composition, the first layer comprising a corundum structure and an r-plane as a principal plane;
a second layer with a second composition that is different from the first composition; and
two or more layers as the first layer and two or more layers as the second layer being alternately stacked to form a superlattice,
the two or more layers comprising a crystalline oxide film that comprises a full width at half maximum (FWHM) of rocking curve that is 0.1° or less by ω-scan X-ray diffraction (XRD) measurement.

15. A crystalline oxide semiconductor film comprising:
at least one crystalline oxide semiconductor selected from a crystalline oxide semiconductor comprising gallium oxide as a major component and a crystalline oxide semiconductor comprising as a major component a mixed crystal comprising gallium oxide with a corundum structure,
the crystalline oxide semiconductor film is an r-plane crystalline oxide semiconductor film with a full width at half maximum (FWHM) of rocking curve that is 0.1° or less by ω-scan X-ray diffraction (XRD) measurement.

16. The crystalline oxide semiconductor film of claim 15, wherein
the crystalline oxide semiconductor film is without a crystal dislocation.

17. The crystalline oxide semiconductor film of claim 15, wherein
the crystalline oxide semiconductor film is with electrical resistivity that is 0.1 Ωcm or less.

18. The crystalline oxide semiconductor film of claim 15, wherein
the crystalline oxide semiconductor film is with electrical resistivity that is in a range of 0.01 Ωcm to 0.07 Ωcm.

19. A semiconductor device comprising:
the crystalline oxide semiconductor film of claim 15 comprising a first side and a second side that is an opposite side of the first side;
a first electrode positioned at the first side of the crystalline oxide semiconductor film; and a second electrode positioned at the second side of the crystalline oxide semiconductor film.

20. A system comprising:
a circuit board; and
the semiconductor device of claim 19 electrically connected to the circuit board.

\* \* \* \* \*